US012630722B2

(12) United States Patent
Yamane et al.

(10) Patent No.: US 12,630,722 B2
(45) **Date of Patent: *May 19, 2026**

(54) WATER REPELLENT AND OIL REPELLENT MEMBER, AND METHOD FOR PRODUCING WATER REPELLENT AND OIL REPELLENT MEMBER

(71) Applicant: SHIN-ETSU CHEMICAL CO., LTD., Tokyo (JP)

(72) Inventors: Yuji Yamane, Annaka (JP); Ryusuke Sakoh, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 896 days.

This patent is subject to a terminal disclaimer.

(21) Appl. No.: 17/611,018

(22) PCT Filed: Apr. 27, 2020

(86) PCT No.: PCT/JP2020/018024

§ 371 (c)(1),
(2) Date: Nov. 12, 2021

(87) PCT Pub. No.: WO2020/230618

PCT Pub. Date: Nov. 19, 2020

(65) Prior Publication Data

US 2022/0243071 A1 Aug. 4, 2022

(30) Foreign Application Priority Data

May 14, 2019 (JP) ................................ 2019-091198

(51) Int. Cl.

| | |
|---|---|
| ***C09D 5/00*** | (2006.01) |
| ***C08G 65/336*** | (2006.01) |
| ***C09D 1/00*** | (2006.01) |
| ***C09D 1/02*** | (2006.01) |
| ***C09D 171/02*** | (2006.01) |
| ***C09D 183/08*** | (2006.01) |
| ***C23C 14/10*** | (2006.01) |
| ***C23C 14/34*** | (2006.01) |

(52) U.S. Cl.

CPC ............... *C09D 5/002* (2013.01); *C09D 1/00* (2013.01); *C09D 171/02* (2013.01); *C09D 183/08* (2013.01); *C23C 14/10* (2013.01); *C23C 14/34* (2013.01)

(58) Field of Classification Search

CPC ........ C09D 5/002; C09D 1/00; C09D 171/02; C09D 183/08; C09D 171/00; C09D 5/1662; C09D 1/02; C23C 14/10; C23C 14/34; B05D 5/086; B05D 7/586; B05D 1/02; B05D 1/18; B05D 3/0254; B05D 7/04; B05D 2201/02; B05D 2401/10; C08G 65/007; C08G 65/336; C09K 3/18

See application file for complete search history.

(56) References Cited

U.S. PATENT DOCUMENTS

| | | | | |
|---|---|---|---|---|
| 6,025,077 A * | 2/2000 | Yamaki | C09D 183/04 524/588 |
| 6,811,884 B2 * | 11/2004 | Goodwin | C09D 4/00 428/428 |
| 2007/0149746 A1 | 6/2007 | Yamane et al. | |
| 2007/0197758 A1 | 8/2007 | Yamane et al. | |
| 2008/0071042 A1 | 3/2008 | Yamane et al. | |
| 2010/0029889 A1 | 2/2010 | Yamane et al. | |
| 2010/0076211 A1 | 3/2010 | Yamane et al. | |
| 2011/0098402 A1 | 4/2011 | Yamane et al. | |
| 2013/0059068 A1 * | 3/2013 | Yajima | G02B 1/041 427/164 |
| 2014/0113145 A1 | 4/2014 | Yamane et al. | |
| 2014/0147680 A1 | 5/2014 | Yamane et al. | |
| 2015/0118502 A1 * | 4/2015 | Mitsuhashi | C07F 7/1804 428/447 |
| 2015/0307719 A1 | 10/2015 | Mitsuhashi et al. | |

(Continued)

FOREIGN PATENT DOCUMENTS

| | | |
|---|---|---|
| EP | 2 711 741 A1 | 3/2014 |
| JP | 10194784 A * | 7/1998 |

(Continued)

OTHER PUBLICATIONS

English Language Translation of JP-10194784-A (Year: 1998).*
International Search Report for PCT/JP2020/018024 mailed on Jul. 21, 2020.
Written Opinion of the International Searching Authority for PCT/JP2020/018024 mailed on Jul. 21, 2020.

*Primary Examiner* — Maria V Ewald
*Assistant Examiner* — Daniel P Dillon
(74) *Attorney, Agent, or Firm* — Birch, Stewart, Kolasch & Birch, LLP

(57) ABSTRACT

A water repellent and oil repellent member which has a functional film layer serving as the first layer on at least one surface of a base material, while having a primer layer serving as the second layer on the outer surface of the functional film layer and additionally having a water repellent and oil repellent layer serving as the third layer on the outer surface of the primer layer, wherein: the primer layer is formed of a layer that has a film thickness of 10-500 nm, while being mainly composed of an organosilicon compound which has a plurality of silanol groups in each molecule; and the water repellent and oil repellent layer is formed of a layer that has a film thickness of 0.5-50 nm, while being mainly composed of a cured product of a hydrolyzable fluorine-containing compound. This water repellent and oil repellent member has excellent rubber eraser abrasion resistance, while exhibiting excellent antistatic properties. In addition, the present invention is capable of forming a water repellent and oil repellent layer having excellent rubber eraser abrasion resistance and excellent antistatic properties on various base materials.

15 Claims, No Drawings

(56) References Cited

U.S. PATENT DOCUMENTS

| | | | | |
|---|---|---|---|---|
| 2019/0177574 | A1* | 6/2019 | Takeda | C08G 77/54 |
| 2019/0217580 | A1* | 7/2019 | Zhou | G06F 3/00 |

FOREIGN PATENT DOCUMENTS

| | | | | | |
|---|---|---|---|---|---|
| JP | 2007-119643 | A | | 5/2007 | |
| JP | 2007-197425 | A | | 8/2007 | |
| JP | 2007-297543 | A | | 11/2007 | |
| JP | 2007-297589 | A | | 11/2007 | |
| JP | 2008-88412 | A | | 4/2008 | |
| JP | 2008-144144 | A | | 6/2008 | |
| JP | 2010-31184 | A | | 2/2010 | |
| JP | 2010-47516 | A | | 3/2010 | |
| JP | 2011-116947 | A | | 6/2011 | |
| JP | 2011-178835 | A | | 9/2011 | |
| JP | 2013-253228 | A | | 12/2013 | |
| JP | 2014-84405 | A | | 5/2014 | |
| JP | 2014-105235 | A | | 6/2014 | |
| JP | 2014-218639 | A | | 11/2014 | |
| JP | 2016-71338 | A | | 5/2016 | |
| WO | WO 2010/038648 | A1 | | 4/2010 | |
| WO | WO 2012/157072 | A1 | | 11/2012 | |
| WO | WO 2013/121984 | A1 | | 8/2013 | |
| WO | WO 2014/097388 | A1 | | 6/2014 | |
| WO | WO-2018235778 | A1 | * | 12/2018 | B05D 5/083 |
| WO | WO 2019/069642 | A1 | | 4/2019 | |
| WO | WO 2020/039795 | A1 | | 2/2020 | |

* cited by examiner

WATER REPELLENT AND OIL REPELLENT MEMBER, AND METHOD FOR PRODUCING WATER REPELLENT AND OIL REPELLENT MEMBER

TECHNICAL FIELD

This invention relates to a water/oil repellent member having excellent abrasion resistance and a method for preparing the same. More particularly, it relates to a water/oil repellent member comprising a functional film layer disposed on the surface of a substrate as a first layer, the functional film layer being composed mainly of silicon dioxide or including an uppermost layer of silicon dioxide, a layer formed as a second layer using an organosilicon compound having a plurality of silanol groups (silicon-bonded hydroxy groups) in the molecule, and a layer formed as a third layer using a fluorinated organosilicon compound, and a method for preparing the same.

BACKGROUND ART

For the purpose of improving aesthetic appearance or visibility, the demand for the technology of rendering articles unsusceptible to staining or the technology of facilitating to clean off stains is increasing every year. In particular, since liquid crystal displays, organic EL displays, eyeglass lenses, smartphones, wearable terminals, car navigation panels, electronic instrument housings, cosmetic and analogous packages, kitchen cabinets, and transportation vehicle bodies are susceptible to deposition of sebum and oil stains on their surface, it is desired to provide their surface with a water/oil repellent layer. However, fluorinated compounds used as the water/oil repellent agent are non-adhesive or non-bondable to various substrates because of very low surface free energy. It is thus difficult to bond the water/oil repellent agent directly to substrates.

To address the problem of bond or adhesion, as a treating agent capable of water/oil repellent treatment on surfaces of glass and other substrates, for example, Patent Document 1 (JP-A 2011-116947) discloses a fluorooxyalkylene group-containing polymer composition having the following average compositional formula:

$$A\text{-}Rf^1\text{—}B \qquad \text{[Chem. 1]}$$

wherein $Rf^1$ is a divalent linear fluorooxyalkylene group containing 5 to 100 repeating units: $—C_dF_{2d}O—$ wherein d is an integer of 1 to 6 and may be different among repeating units, A and B are each independently a group selected from $Rf^2$ and the following formula:

[Chem. 2]

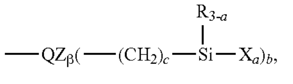

$Rf^2$ is F, H, or a monovalent fluorinated group terminated with $—CF_3$ or $—CF_2H$ group, Q is a divalent organic group, Z is a di- to heptavalent organopolysiloxane residue having a siloxane bond, R is $C_{1-4}$ alkyl or phenyl, X is a hydrolyzable group, a is 2 or 3, b is an integer of 1 to 6, c is an integer of 1 to 5, and β is an integer of 0 or 1.

The treating agent of Patent Document 1 exhibits relatively good durability, but is still unsatisfactory and in particular, difficult to provide good adhesion to resins, sapphire, ceramics and the like.

As the means for improving adhesion, Patent Document 2 (WO 2014/097388) discloses a method of depositing a $SiO_2$ layer as a primer layer by a dry process like evaporation, sputtering or CVD. It is described that a water/oil repellent layer having good durability is formed on a glass substrate by this method. However, no satisfactory durability is displayed in a severe reliability test like the test of rubbing the surface with an eraser.

On the other hand, Patent Document 3 (WO 2010/038648) discloses a polysilazane solution from which a primer layer is deposited by a wet process. After the polysilazane solution is coated, the polysilazane is converted to silica glass through reaction with moisture. Although this method is superior to the dry method in that the vacuum process is not used, no satisfactory durability is displayed in a severe reliability test like the test of rubbing the surface with an eraser.

Moreover, a member having a water/oil repellent layer formed on a substrate by the above method often has a higher surface resistivity than the surface resistivity of the substrate, giving rise to the problem of frequent electric charging. A variety of antistatic agents are thus proposed. Since the antistatic agent is added to a composition, water/oil repellency and antifouling properties at the surface are insufficient. It is difficult for a water/oil repellent surface to meet both high abrasion resistance and antistatic properties.

As the prior art technology relating to the present invention, the following documents are cited as well as the above-cited documents.

PRIOR ART DOCUMENTS

Patent Documents

Patent Document 1: JP-A 2011-116947
Patent Document 2: WO 2014/097388
Patent Document 3: WO 2010/038648
Patent Document 4: JP-A 2007-197425
Patent Document 5: JP-A 2007-297589
Patent Document 6: JP-A 2007-297543
Patent Document 7: JP-A 2008-088412
Patent Document 8: JP-A 2008-144144
Patent Document 9: JP-A 2010-031184
Patent Document 10: JP-A 2010-047516
Patent Document 11: JP-A 2011-178835
Patent Document 12: JP-A 2014-084405
Patent Document 13: JP-A 2014-105235
Patent Document 14: JP-A 2013-253228
Patent Document 15: JP-A 2014-218639
Patent Document 16: WO 2013/121984

SUMMARY OF INVENTION

Technical Problem

An object of the invention, which has been made under the above-mentioned circumstances, is to provide a water/oil repellent member having improved eraser abrasion resistance and antistatic properties, and a method for preparing a water/oil repellent member by depositing a water/oil repellent layer having improved antistatic properties on any one of various substrates.

Solution to Problem

Making extensive investigations to attain the above object, the inventors have found that a water/oil repellent member comprising a functional film layer (or first layer) formed on any one of various substrates, the functional film layer being composed mainly of silicon dioxide or including an outermost layer of silicon dioxide, a primer layer (or second layer) disposed on the outer surface of the functional film layer, composed mainly of an organosilicon compound having a plurality of silanol groups in the molecule, and having a specific thickness, and a water/oil repellent layer (or third layer) disposed on the outer surface of the primer layer, composed mainly of a cured product of a hydrolyzable fluorinated compound, and having a specific thickness, is obtained by a method comprising the steps of forming a functional film layer on at least one surface of a substrate, the functional film layer being composed mainly of silicon dioxide or including at least an outermost layer of silicon dioxide, wet coating a solution of an organosilicon compound having a plurality of silanol groups in its molecule in a solvent, evaporating the solvent to form a primer layer on the at least one surface of the substrate, wet coating a solution of a hydrolyzable fluorinated compound in a solvent onto the outer surface of the primer layer and evaporating the solvent, or dry coating onto the outer surface of the primer layer the hydrolyzable fluorinated compound obtained by evaporating the solvent from the solution, and curing the hydrolyzable fluorinated compound to form and lay a water/oil repellent layer on the outer surface of the primer layer; that the water/oil repellent member has improved eraser abrasion resistance and antistatic properties (i.e., the surface resistivity on the outer surface is lower by at least 10Ω/□ than in the absence of the second layer), and the invention can endow various substrates with a water/oil repellent coating having the improved functions of eraser abrasion resistance and antistatic properties (i.e., the surface resistivity on the outer surface is lower by at least 10Ω/□ than in the absence of the second layer) in a consistent simple manner. The invention is predicated on this finding.

Accordingly, the invention provides a water/oil repellent member and a method for preparing the same, as defined below.

[1]

A water/oil repellent member comprising a substrate, a functional film layer disposed on at least one surface of the substrate as a first layer, a primer layer disposed on the outer surface of the functional film layer as a second layer, and a water/oil repellent layer disposed on the outer surface of the primer layer as a third layer, wherein the primer layer is a layer composed mainly of an organosilicon compound having a plurality of silanol groups in the molecule and having a thickness of 10 to 500 nm, and the water/oil repellent layer is a layer composed mainly of a cured product of a hydrolyzable fluorinated compound and having a thickness of 0.5 to 50 nm.

[2]

The water/oil repellent member of [1] wherein the functional film layer is, in its entirety, composed mainly of silicon dioxide or includes at least an outermost layer composed of silicon dioxide.

[3]

The water/oil repellent member of [1] or [2] wherein the organosilicon compound having a plurality of silanol groups in the molecule is a hydrolytic partial condensate of a tetraalkoxysilane.

[4]

The water/oil repellent member of any one of [1] to [3] wherein the hydrolyzable fluorinated compound has at least one hydrolyzable silyl group at one or more ends of the molecular chain, the hydrolyzable silyl group being selected from among $C_{1-12}$ alkoxy groups, $C_{2-12}$ alkoxyalkoxy groups, $C_{1-10}$ acyloxy groups, $C_{2-10}$ alkenyloxy groups, halogen or amino-containing silyl groups, and silazane groups.

[5]

The water/oil repellent member of any one of [1] to [4] wherein the hydrolyzable fluorinated compound is a fluorooxyalkylene group-containing organosilicon compound having, in its molecule, a divalent linear perfluorooxyalkylene polymer residue of the formula: $-(CF_2)_d-O-(CF_2O)_p(CF_2CF_2O)_q(CF_2CF_2CF_2O)_r(CF_2CF_2CF_2CF_2O)_s(CF(CF_3)CF_2O)_t-(CF_2)_d-$ wherein p, q, r, s, and t are each independently an integer of 0 to 200, p+q+r+s+t is 3 to 500, each repeat unit in parentheses may be randomly arranged, d is independently an integer of 0 to 8, the unit with d may be linear or branched, and having at least one hydrolyzable silyl group at one or more ends of the molecular chain.

The water/oil repellent member of any one of [1] to [5] wherein the hydrolyzable fluorinated compound is at least one compound selected from hydrolyzable fluorinated organosilicon compounds having the general formulae (1) to (5):

$$(A\text{-}Rf)_\alpha-ZW_\beta \quad (1)$$

$$Rf-(ZW_\beta)_2 \quad (2)$$

$$Z'-(Rf-ZW_\beta)_\gamma \quad (3)$$

wherein Rf is a divalent linear perfluorooxyalkylene polymer residue of the formula: $-(CF_2)_d-O-(CF_2O)_p(CF_2CF_2O)_q(CF_2CF_2CF_2O)_r(CF_2CF_2CF_2CF_2O)_s(CF(CF_3)CF_2O)_t-(CF_2)_d-$, p, q, r, s, and t are each independently an integer of 0 to 200, p+q+r+s+t is 3 to 500, each repeat unit in parentheses may be randomly arranged, d is independently an integer of 0 to 8, the unit with d may be linear or branched, A is fluorine, hydrogen or a monovalent fluorinated group terminated with $-CF_3$, $-CF_2H$ or $-CH_2F$ group, Z and Z' are each independently a single bond, or a di- to octavalent organic group which may contain nitrogen, oxygen, silicon, phosphorus or sulfur and which may be fluorinated, W is a monovalent organic group terminated with a hydrolyzable group, α and β are each independently an integer of 1 to 7, α+β is 2 to 8, and γ is an integer of 2 to 8, $$A\text{-}Rf\text{-}Q\text{-}(Y)_\delta-B \quad (4)$$

$$Rf\text{-}(Q\text{-}(Y)_\delta-B)_2 \quad (5)$$

wherein Rf and A are as defined above, Q is a single bond or divalent organic group, δ is each independently an integer of 1 to 10, Y is a divalent organic group having a hydrolyzable group, and B is hydrogen, $C_{1-4}$ alkyl or halogen.

[7]

The water/oil repellent member of [6] wherein the hydrolyzable fluorinated organosilicon compound is selected from the following:

[Chem. 3]
$CF_3O-(CF_2CF_2O)_{q1}-(CF_2CF_2CF_2CF_2O)_{s1}-CF_2CF_2CF_2-C_2H_4-Si(OMe)_3$
[Chem. 4]
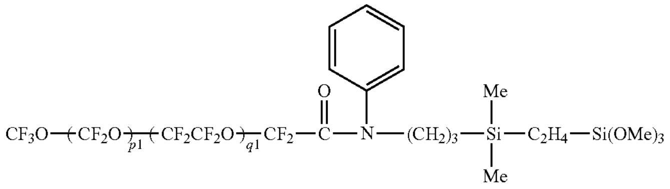
[Chem. 5]
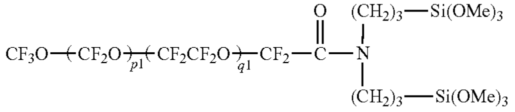
[Chem. 6]
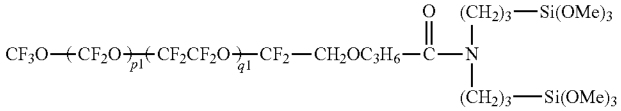
[Chem. 7]
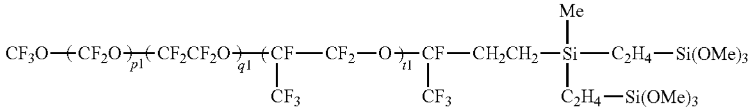
[Chem. 8]
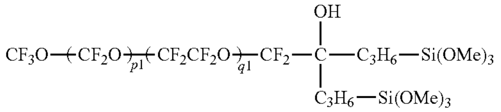
[Chem. 9]
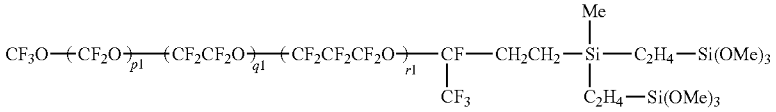
[Chem. 10]
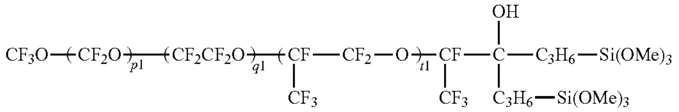
[Chem. 11]
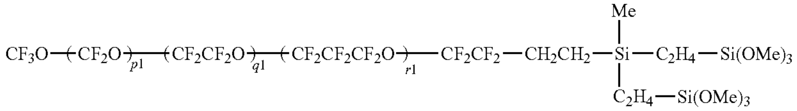
[Chem. 12]
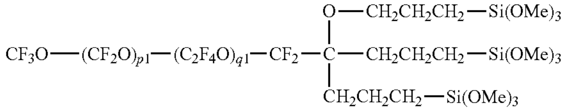
[Chem. 13]
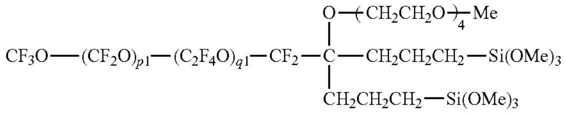

-continued
[Chem. 14]
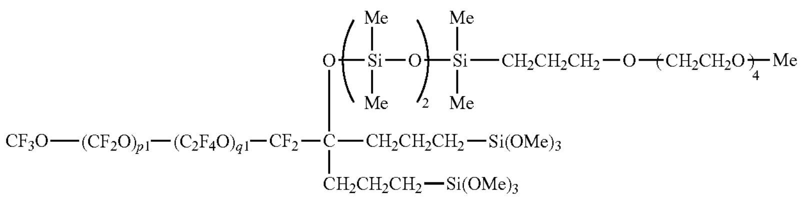
[Chem. 15]
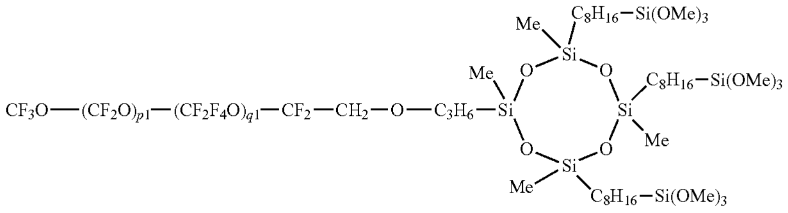
[Chem. 16]
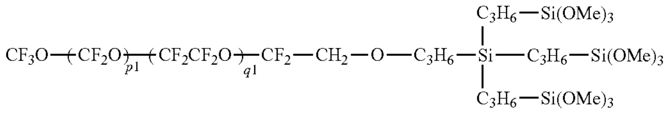
[Chem. 17]
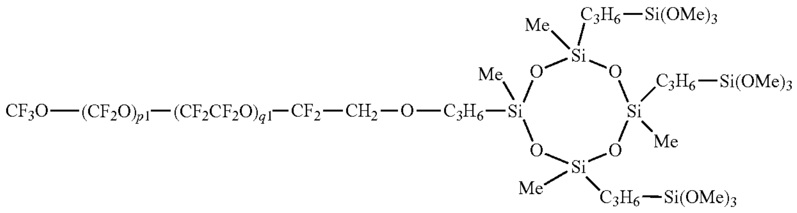
[Chem. 18]
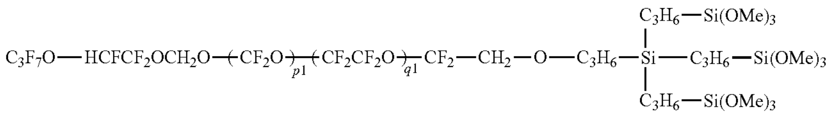
[Chem. 19]
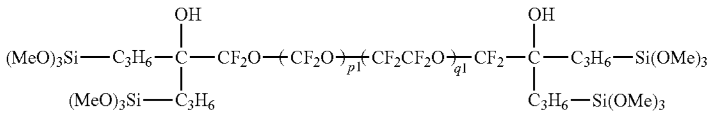
[Chem. 20]
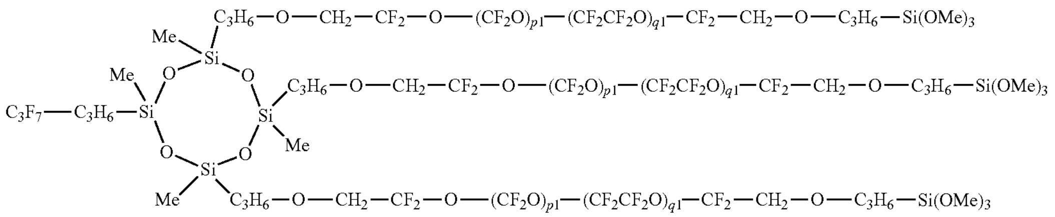
[Chem. 21]
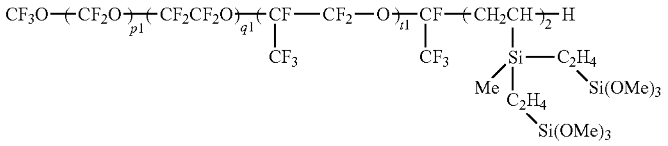

-continued
[Chem. 22]
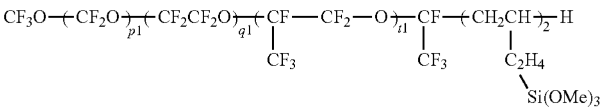
[Chem. 23]
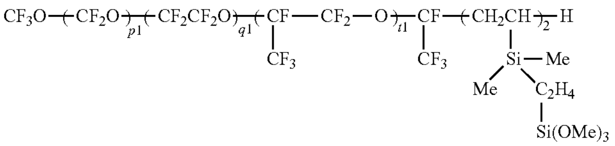
[Chem. 24]
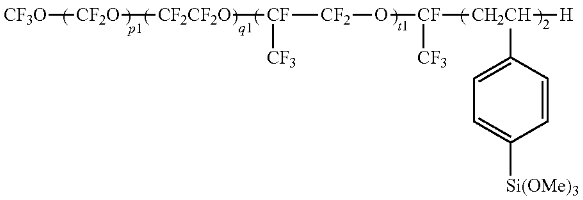
[Chem. 25]
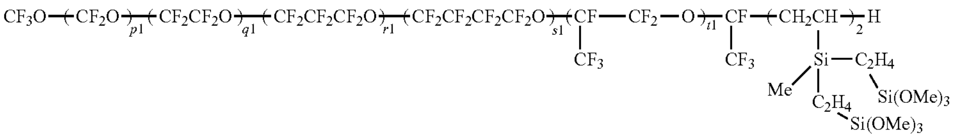
[Chem. 26]
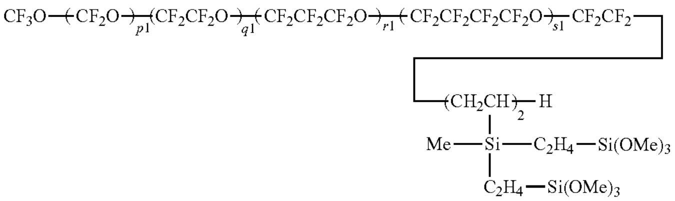
[Chem. 27]
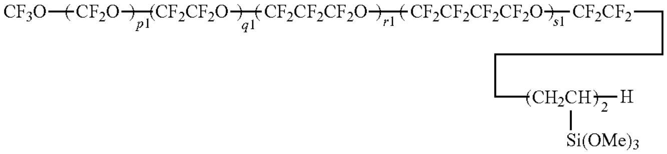
[Chem. 28]
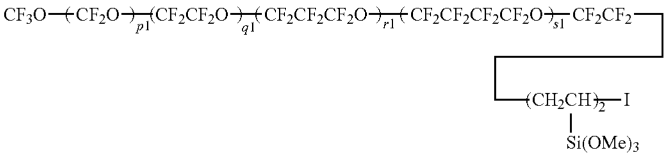
[Chem. 29]
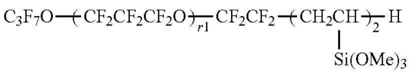
[Chem. 30]
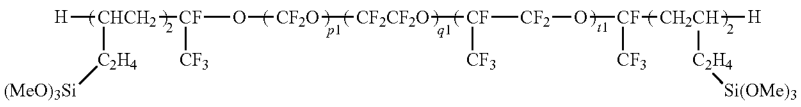

wherein Me is methyl, p1, q1, r1, s1, and t1 are each independently an integer of 1 to 200, the sum of p1, q1, r1, s1, and t1 is 3 to 500, each repeat unit in parentheses may be randomly arranged.

[8]

The water/oil repellent member of any one of [1] to [7] wherein the substrate is of a resin, ceramic, metal, quartz, glass, sapphire, or diamond.

[9]

A method for preparing the water/oil repellent member of any one of [1] to [8], the method comprising the steps of:

- forming a functional film layer on at least one surface of a substrate, the functional film layer being composed mainly of silicon dioxide or including at least an outermost layer of silicon dioxide,
- wet coating a solution of an organosilicon compound having a plurality of silanol groups in the molecule in a solvent onto the outer surface of the functional film layer, and then evaporating the solvent to form and lay a primer layer on at least one surface of the substrate,
- wet coating a solution of a hydrolyzable fluorinated compound in a solvent onto the outer surface of the primer layer and then evaporating the solvent, or evaporating off the solvent from the solution and dry coating the hydrolyzable fluorinated compound onto the outer surface of the primer layer, and curing the hydrolyzable fluorinated compound to form and lay a water/oil repellent layer on the outer surface of the primer layer.

It is noted that the "linear perfluorooxyalkylene polymer residue" as used herein means that the divalent fluorooxyalkylene repeating units by which the backbone perfluorooxyalkylene structure is constructed are linearly linked. It is acceptable that individual divalent fluorooxyalkylene units themselves be fluorooxyalkylene units having a branched structure such as $—[CF_2CF(CF_3)O]—$.

Advantageous Effects of Invention

According to the invention, there is provided a water/oil repellent member meeting both antistatic and water/oil repellent properties on its surface and having improved eraser abrasion resistance. The method for preparing the water/oil repellent member enables to form the relevant layers by the vacuum process or the wet process (e.g., brush coating, spin coating, spraying, gravure coating, die coating, bar coating or slit coating). The water/oil repellent member and the method are useful in a variety of applications, especially the application where the surface comes in contact with fingers or tools, for example, articles whose function can be lost by electrostatic charges, typically touch panel displays, flexible displays, electronic instrument housings, wearable terminals, eyeglass lenses, protective films, protective glass, glass for copiers, vehicle mount cameras, radar covers for automatic driving, quartz glass for semiconductor part manufacture, and the like, articles which should avoid a loss of visibility and flaws by electrostatic deposition of dust and debris, articles whose visibility and aesthetic appearance are degraded by deposition of fingerprints, oil or water, and articles in which fur and stains are deposited from water and removed by rubbing, typically kitchen sinks, faucets, and shower heads.

DESCRIPTION OF EMBODIMENTS

Now the invention is described in detail.

The invention provides a water/oil repellent member comprising a substrate, a functional film layer disposed on at least one surface of the substrate as a first layer, a primer layer disposed on the outer surface of the functional film layer as a second layer, and a water/oil repellent layer disposed on the outer surface of the primer layer as a third layer, wherein the primer layer is a layer composed mainly of an organosilicon compound having a plurality of silanol groups in the molecule and having a thickness of 10 to 500 nm, and the water/oil repellent layer is a layer composed mainly of a cured product of a hydrolyzable fluorinated compound and having a thickness of 0.5 to 50 nm.

According to the invention, for example, by a method comprising the steps of forming a functional film layer (first layer) on a surface (at least one surface) of any one of various substrates, the functional film layer being composed mainly of silicon dioxide or including at least an outermost layer of silicon dioxide, wet coating a solution of an organosilicon compound having a plurality of silanol groups in the molecule in a solvent onto the outer surface of the functional film layer and then evaporating the solvent to form and lay a primer layer (second layer) on the functional film layer, wet coating a solution of a hydrolyzable fluorinated compound in a solvent (water/oil repellent agent) onto the outer surface of the primer layer and then evaporating the solvent, or dry coating the hydrolyzable fluorinated compound obtained by evaporating the solvent from the solution (water/oil repellent agent) onto the outer surface of the primer layer, and curing the hydrolyzable fluorinated compound to form a water/oil repellent layer (third layer) on the outer surface of the primer layer, there is obtained a water/oil repellent member comprising a primer layer (second layer) disposed on the surface of a substrate, composed mainly of an organosilicon compound having a plurality of silanol groups in the molecule, and having a thickness of 10 to 500 nm, and a water/oil repellent layer (third layer) disposed on the surface of the primer layer, composed mainly of a cured product of a hydrolyzable fluorinated compound, and having a thickness of 0.5 to 50 nm.

The substrate which can be used herein is not particularly limited and is preferably selected from resins, ceramics, metals, quartz, glass, sapphire, and diamond.

Suitable substrate-forming resins include thermoplastic resins and thermosetting resins. Specifically stated, suitable thermoplastic resins include celluloid, cellulose acetate, cellulose propionate, cellulose butyrate, triacetyl cellulose, aliphatic polyamides such as nylon 6, nylon 66, nylon 12, aromatic polyamides, ABS resins, AS resins, polystyrene, polyolefins such as polyethylene (low density or high density) and polypropylene, cycloolefin polymers, polyvinyl chloride, polyvinylidene chloride, ethylene-vinyl acetate copolymers, polyvinyl alcohol, polyacetal, saturated polyesters such as polycarbonate, polyethylene terephthalate, and polybutylene terephthalate, aromatic polyesters, polyether ketones, polyether ether ketones, polysulfone, polyether sulfone, polyether imide, polyarylate, polymethylpentene, ionomers, liquid crystal polymers, polyimides, polyamide imides, fluoro-resins, polyphenylene sulfide, (modified) polyphenylene oxide, and thermoplastic polyurethane. Suitable thermosetting resins include epoxy resins, unsaturated polyesters, thermosetting polyurethane, polyimide, diethylene glycol bisallyl carbonate polymers (commonly known as CR-39), (co)polymers of di(meth)acrylate of (halogenated) bisphenol A, (co)polymers of urethane-modified di(meth)acrylate of (halogenated) bisphenol A, and copolymers of diacrylate compounds or vinyl benzyl alcohol with unsaturated thiol compounds.

The functional film layer (first layer) formed and laid on at least one surface of the substrate is such a functional film layer as a hard coat layer, antireflective layer or IR cutoff filter layer. The function of the functional film layer is not limited to these functions. It suffices that the functional film layer is in its entirety composed mainly of silicon dioxide, or includes at least an outermost layer composed of silicon dioxide. The functional film layer (first layer), specifically the entire functional film layer (silicon dioxide layer) or the outermost layer (silicon dioxide layer) of the functional film layer preferably has a thickness of the order of 10 to 500 nm, more preferably 10 to 150 nm.

Specifically, the functional film layer is a hard coat layer composed mainly of a silicon dioxide layer, a hard coat layer of two, three or multilayer structure including a hard coat layer and a silicon dioxide layer formed thereon, an antireflective layer of two, three or multilayer structure having an outermost layer of silicon dioxide formed on a substrate, an IR cutoff filter layer of two, three or multilayer structure having an outermost layer of silicon dioxide formed on a substrate, or the like.

The primer layer (second layer) formed and laid on the outer surface of the functional film layer is composed mainly of an organosilicon compound having a plurality of silanol groups in the molecule, preferably at least 50% by weight of the organosilicon compound, and has a thickness of 10 to 500 nm. The primer layer may be formed or laminated, for example, by wet coating a solution of an organosilicon compound having a plurality of silanol groups in the molecule in a solvent onto the outer surface of the functional film layer, and evaporating off the solvent.

The organosilicon compound having a plurality of silanol groups in the molecule should preferably have at least two, more preferably at least three, and even more preferably at least four silanol groups per molecule. If the number of silanol groups per molecule is too small, the adhesion of the primer layer (second layer) to the inner surface of the water/oil repellent layer (third layer) to be laid on the outer surface of the primer layer may be aggravated or the surface resistivity may not become low. It is noted that the organosilicon compound having a plurality of silanol groups in the molecule should preferably have a silanol content of 0.002 to 0.042 mol/g, more preferably 0.004 to 0.035 mol/g, and even more preferably 0.005 to 0.030 mol/g.

The organosilicon compound having a plurality of silanol groups in the molecule may be obtained from hydrolysis and partial condensation of an organosilicon compound having a plurality of hydrolyzable groups such as alkoxy groups, e.g., methoxy or ethoxy or halogen atoms, e.g., chlorine in the molecule.

Examples of the organosilicon compound having a plurality of hydrolyzable groups in the molecule include methyltrimethoxysilane, dimethyldimethoxysilane, phenyltrimethoxysilane, diphenyldimethoxysilane, tetramethoxysilane, tetraethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, decyltrimethoxysilane, 1,6-bis(trimethoxysilyl)hexane, trifluoropropyltrimethoxysilane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, tris(trimethoxysilylpropyl) isocyanurate, trichlorosilane, and dichlorosilane, which may be used in admixture.

In the practice of the invention, a higher molecular weight product (partial condensate) obtained by hydrolyzing an organosilicon compound having a plurality of hydrolyzable groups, typically organosilane as mentioned above, and effecting partial dehydrating condensation is preferably used as the organosilicon compound having a plurality of silanol groups in the molecule. As used herein, the partial condensate refers to an organopolysiloxane compound having a plurality of residual silanol groups in the molecule, which is obtained from hydrolysis of an organosilicon compound having a plurality of hydrolyzable groups, typically organosilane and subsequent partial dehydrating condensation of the resulting organosilane having a plurality of silanol groups (silicon-bonded hydroxy groups) in the molecule.

The hydrolytic partial condensate (i.e., organosilicon compound having a plurality of silanol groups in the molecule) obtained from the organosilicon compound having a plurality of hydrolyzable groups in the molecule should preferably have a weight average molecular weight of 300 to 100,000, more preferably 5,000 to 50,000. As used herein, the weight average molecular weight may be determined, for example, by gel permeation chromatography (GPC) using toluene as developing solvent versus polystyrene standards (the same holds true, hereinafter).

Most preferably, the organosilicon compound having a plurality of silanol groups in the molecule used herein is a hydrolytic partial condensate of a tetraalkoxysilane such as tetramethoxysilane or tetraethoxysilane.

The organosilicon compound having a plurality of silanol groups in the molecule is desirably diluted with a solvent. Preferred examples of the solvent for diluting the organosilicon compound having a plurality of silanol groups in the molecule include alcohols such as methanol, ethanol, isopropanol and butanol, and ethers such as propylene glycol monomethyl ether and polyethylene glycol monopropyl ether, but are not limited thereto. An appropriate solvent may be selected in view of wetting of the first layer and boiling point. The solution of the organosilicon compound having a plurality of silanol groups in the molecule in a solvent should preferably contain the organosilicon compound in a concentration of 0.01 to 10% by weight, more preferably 0.6 to 4% by weight. If the concentration is too low, more portions may be left uncoated. If the concentration is too high, secondary agglomeration can take place between silanol groups.

In the solution of the organosilicon compound having a plurality of silanol groups in the molecule in a solvent, additives such as UV absorbers, photo-stabilizers, antioxidants, leveling agents, anti-foaming agents, pigments, dyes, dispersants, antistatic agents, anti-fogging agents, and surfactants may be used if necessary. The optional additives are preferably added in such amounts that the organosilicon compound having a plurality of silanol groups in the molecule may account for at least 50% by weight (50 to 100% by weight), especially 80 to 100% by weight of the primer layer obtained after removal of the solvent whereas the additives account for up to 50% by weight (0 to 50% by weight), especially 0 to 20% by weight.

A primer layer composed mainly of the organosilicon compound having a plurality of silanol groups in the molecule may be formed by coating the solution of the organosilicon compound having a plurality of silanol groups in the molecule in a solvent onto the outer surface of the functional film layer by a wet coating process, specifically dipping, brush coating, spin coating, spray coating, gravure coating, die coating, bar coating, slit coating or flow coating, and then evaporating off the solvent. If desired, the coating may be heated at a temperature in the range which does not affect the substrate, for example, at 40 to 500° C. for 10 seconds to 24 hours.

The primer layer (second layer) formed and laid on the outer surface of the functional film layer typically has a thickness of 10 to 500 nm, preferably 30 to 400 nm, more preferably 30 to 250 nm. As used herein, the thickness of a layer may be measured by any well-known methods such as spectral ellipsometry and X-ray reflection method (the same holds true, hereinafter).

Next, the water/oil repellent layer (third layer) which is formed and laid on the outer surface of the primer layer is a layer composed mainly of a cured product of a hydrolyzable fluorinated compound and having a thickness of 0.5 to 50 nm.

The water/oil repellent layer may be formed and laid on the primer layer, for example, by coating a solution of a hydrolyzable fluorinated compound in a solvent (water/oil repellent agent) onto the outer surface of the primer layer (second layer) and curing the agent.

The hydrolyzable fluorinated compound used herein may be selected from the hydrolyzable fluorinated organosilicon compounds which are described in JP-A 2007-197425, JP-A 2007-297589, JP-A 2007-297543, JP-A 2008-088412, JP-A 2008-144144, JP-A 2010-031184, JP-A 2010-047516, JP-A 2011-116947, JP-A 2011-178835, JP-A 2014-084405, JP-A 2014-105235, JP-A 2013-253228, JP-A 2014-218639, and WO 2013/121984 (Patent Documents 1, 4 to 16).

The hydrolyzable fluorinated compound is described in further detail.

The hydrolyzable fluorinated compound used herein is preferably a hydrolyzable fluorinated compound having at least one, preferably 1 to 6, more preferably 1 to 4 hydrolyzable silyl groups (for example, silyl groups having 1 to 3 silicon-bonded hydrolyzable groups such as alkoxy groups, e.g., trialkoxysilyl, dialkoxy(organo)silyl or alkoxy(diorgano)silyl groups) at each of one or more ends, preferably 1 to 14 ends, more preferably 1 to 7 ends of the molecular chain (for example, having at least one, preferably 1 to 20, more preferably 2 to 14, even more preferably 2 to 8 hydrolyzable silyl groups per molecule). More preferably the compound is an organosilicon compound having a hydrolyzable silyl group and fluorine in the molecule, the hydrolyzable silyl group being selected from hydrolyzable silyl groups each having 1 to 3 hydrolyzable groups, for example, $C_{1-12}$, especially $C_{1-10}$ alkoxy groups such as methoxy, ethoxy, propoxy and butoxy, $C_{2-12}$, especially $C_{2-10}$ alkoxyalkoxy groups such as methoxymethoxy and methoxyethoxy, $C_{1-10}$ acyloxy groups such as acetoxy and propionoxy, $C_{2-10}$ alkenyloxy groups such as vinyloxy and isopropenoxy, halogen groups such as chloro, bromo and iodo, primary or secondary amino groups, and silazane groups.

The hydrolyzable fluorinated compound is preferably a compound having a fluorooxyalkylene group (i.e., mono- or divalent perfluoropolyether residue) in the molecule. The fluorooxyalkylene group refers to a compound of (poly) fluorooxyalkylene structure (i.e., divalent linear perfluorooxyalkylene polymer residue) having a plurality of repeating units: $—C_jF_{2j}O—$ bonded wherein j is an integer of at least 1, preferably 1 to 6, more preferably 1 to 4. Especially, the structure may have 3 to 500, preferably 15 to 200, more preferably 20 to 100, even more preferably 25 to 80 repeating units.

The repeating units: $—C_jF_{2j}O—$ may be linear or branched. Examples include the following units while repeating units of more than one type may be bonded.

$—CF_2O—$
$—CF_2CF_2O—$
$—CF_2CF_2CF_2O—$
$—CF(CF_3)CF_2O—$
$—CF_2CF_2CF_2CF_2O—$
$—CF_2CF_2CF_2CF_2CF_2O—$
$—C(CF_3)_2O—$

Most preferably, the (poly)fluorooxyalkylene structure (i.e., divalent linear perfluorooxyalkylene polymer residue) is $—(CF_2)_d—O—(CF_2O)_p(CF_2CF_2O)_q(CF_2CF_2CF_2O)_r(CF_2CF_2CF_2CF_2O)_s(CF(CF_3)CF_2O)_t—(CF_2)_d—$, wherein p, q, r, s, and t are each independently an integer of 0 to 200, preferably p is an integer of 5 to 100, q is an integer of 5 to 100, r is an integer of 0 to 100, s is an integer of 0 to 50, t is an integer of 0 to 100, and p+q+r+s+t is an integer of 3 to 500, preferably an integer of 10 to 105. Each unit in parentheses may be randomly arranged. The subscript d is independently an integer of 0 to 8, preferably an integer of 0 to 5, more preferably an integer of 0 to 2, and the unit with d may be linear or branched. Specific examples are shown by the following structures.

[Chem. 31]

$—(CF_2)_{d'}—O—(CF_2CF_2O)_{q'}—(CF_2)_{d'}—$ $—(CF_2)_{d'}—O—(CF_2CF_2CF_2O)_{r'}—(CF_2)_{d'}—$

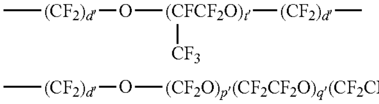

$—(CF_2)_{d'}—O—(CF_2O)_{p'}(CF_2CF_2O)_{q'}—(CF_2)_{d'}—$ $—(CF_2)_{d'}—O—(CF_2O)_{p'}(CF_2CF_2O)_{q'}(CF_2CF_2CF_2O)_{r'}—(CF_2)_{d'}—$ $—(CF_2)_{d'}—O—(CF_2O)_{p'}(CF_2CF_2O)_{q'}(CF_2CF_2CF_2CF_2O)_{s'}—(CF_2)_{d'}—$

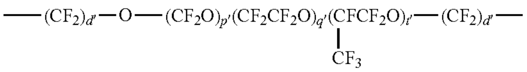

$—(CF_2)_{d'}—O—(CF_2O)_{p'}(CF_2CF_2O)_{q'}(CF_2CF_2CF_2O)_{r'}(CF_2CF_2CF_2CF_2O)_{s'}—(CF_2)_{d'}—$

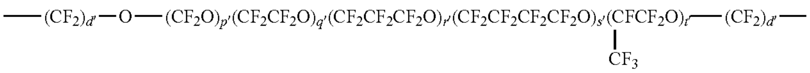

$—(CF_2)_{d'}—O—(CF_2CF_2O)_{q'}(CF_2CF_2CF_2CF_2O)_{s'}—(CF_2)_{d'}—$

Herein p', q', r', s', and t' are each independently an integer of 1 to 200, the sum of p', q', r', s', and t' is 3 to 500, each unit in parentheses may be randomly arranged, d' is independently an integer of 0 to 5, and the unit with d' may be linear or branched.

More preferably, the hydrolyzable fluorinated compound used herein is a hydrolyzable fluorinated organosilicon compound (or hydrolyzable fluorine-containing organosilicon compound) having any one of the general formulae (1) to (5). The compounds may be used alone or in admixture.

$$(A\text{-}Rf)_{\alpha}\text{—}ZW_{\beta} \quad (1)$$

$$Rf\text{—}(ZW_{\beta})_2 \quad (2)$$

$$Z'\text{—}(Rf\text{—}ZW_{\beta})_{\gamma} \quad (3)$$

$$A\text{-}Rf\text{-}Q\text{-}(Y)_{\delta}\text{—}B \quad (4)$$

$$Rf\text{-}(Q\text{-}(Y)_{\delta}\text{—}B)_2 \quad (5)$$

In formulae (1) to (5), Rf is a divalent linear perfluorooxyalkylene polymer residue: $—(CF_2)_d—O—(CF_2O)_p(CF_2CF_2O)_q(CF_2CF_2CF_2O)_r(CF_2CF_2CF_2CF_2O)_s(CF(CF_3)CF_2O)_t—(CF_2)_d—$, p, q, r, s, and t are each independently an integer of 0 to 200, p+q+r+s+t is 3 to 500, each repeating unit in parentheses may be randomly arranged, d is an integer of 0 to 8, the unit with d may be linear or branched. "A" is fluorine, hydrogen or a monovalent fluorinated group terminated with $—CF_3$, $—CF_2H$ or $—CH_2F$ group, Z and Z' are each independently a single bond, or a di- to octavalent organic group which may contain nitrogen, oxygen, silicon, phosphorus or sulfur and which may be fluorinated, W is a monovalent organic group terminated with a hydrolyzable group. The subscripts α and β are each independently an integer of 1 to 7, preferably α is an integer of 1 to 3, more preferably 1, β is an integer of 1 to 3, α+β is an integer of 2 to 8, preferably an integer of 2 to 4, and γ is an integer of 2 to 8, preferably 2 or 3.

Q is a single bond or divalent organic group, δ is independently an integer of 1 to 10, Y is a divalent organic group having a hydrolyzable group, and B is hydrogen, $C_{1-4}$ alkyl or halogen.

In formulae (1) to (5), Rf is the above-described (poly) fluorooxyalkylene structure (divalent linear perfluorooxyalkylene polymer residue): $—(CF_2)_d—O—(CF_2O)_p(CF_2CF_2O)_q(CF_2CF_2CF_2O)_r(CF_2CF_2CF_2CF_2O)_s(CF(CF_3)CF_2O)_t—(CF_2)_d—$, examples of which are as illustrated above.

In formulae (1) and (4), "A" is fluorine, hydrogen or a monovalent fluorinated group terminated with $—CF_3$, $—CF_2H$ or $—CH_2F$ group. Examples of the monovalent fluorinated group terminated with $—CF_3$, $—CF_2H$ or $—CH_2F$ group include $—CF_3$, $—CF_2CF_3$, $—CF_2CF_2CF_3$, $—CH_2CF(CF_3)—OC_3F_7$, and $—CH_2OCF_2CFH—OC_3F_7$. Inter alia, A is preferably $—CF_3$, $—CF_2CF_3$, $—CF_2CF_2CF_3$, or $—CH_2OCF_2CFH—OC_3F_7$.

In formulae (1) to (3), Z and Z' are each independently a single bond, or a di- to octavalent organic group which may contain nitrogen, oxygen, silicon, phosphorus or sulfur and which may be fluorinated. The organic group may be represented by $(L)_e$-M wherein e is an integer of 1 to 7, preferably 1 to 3.

Herein L is a single bond, oxygen, sulfur or a divalent organic group. In formulae (1) to (3), L in Z is a linking group between Rf group and M group (or W group), and L in Z' is a linking group between M group (or Rf group) and Rf group. The divalent organic group is preferably an unsubstituted or substituted $C_{2-12}$ divalent organic group which may contain one or more selected from the group consisting of amide bond, ether bond, carbonyl bond, ester bond, diorganosilylene groups such as dimethylsilylene, and groups of the formula: $—Si[OH][(CH_2)_fSi(CH_3)_3]—$ wherein f is an integer of 2 to 4, more preferably an unsubstituted or substituted $C_{2-12}$ divalent hydrocarbon group which may contain the foregoing structure.

Examples of the unsubstituted or substituted $C_{2-12}$ divalent hydrocarbon group include alkylene groups such as ethylene, propylene (trimethylene or methylethylene), butylene (tetramethylene or methylpropylene), hexamethylene, and octamethylene, arylene groups such as phenylene, and combinations of two or more such groups, such as alkylene-arylene groups. In these groups, some or all of the carbon-bonded hydrogen atoms may be substituted by halogen atoms such as fluorine and iodine. Inter alia, unsubstituted or substituted $C_{2-4}$ alkylene groups or phenylene groups are preferred.

Examples of the divalent organic group L include groups of the following structure, and combinations of two or more such groups.

[Chem. 32]

$$—(CH_2)_u—O—(CH_2)_v—$$

[Chem. 33]

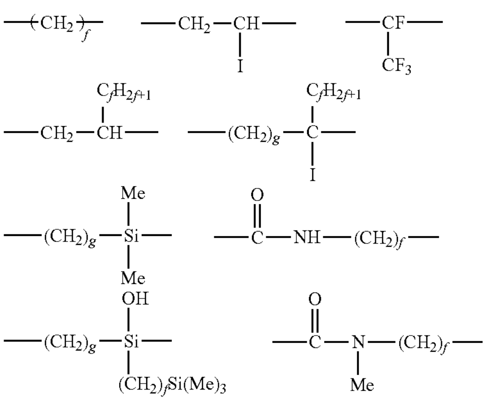

[Chem. 34]

[Chem. 35]

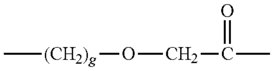

[Chem. 36]

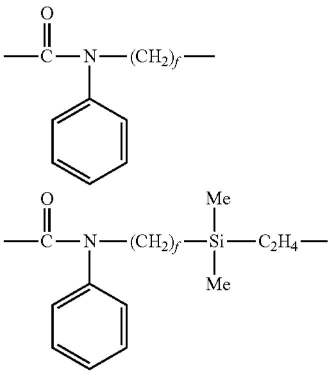

-continued

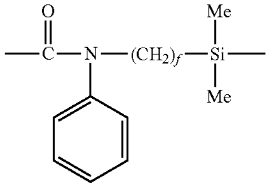

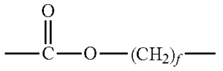

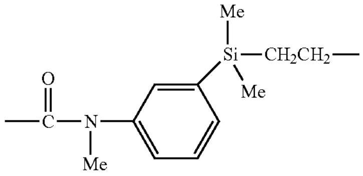

[Chem. 37]

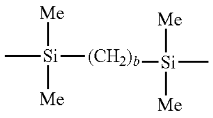

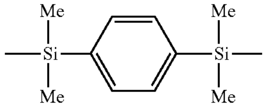

Herein f is an integer of 2 to 4, b is an integer of 2 to 6, preferably 2 to 4, u and v each are an integer of 1 to 4, g is an integer of 2 to 4, and Me is methyl.

Also, M is a single bond, nitrogen, silicon, carbon, phosphorus, or a di- to octavalent, i.e., (e+1)-valent organic group containing such atom. Specifically, M is a single bond, divalent group —$R^1_2C$—, divalent group —$R^3_2Si$—, divalent group —$NR^4$—, trivalent group —N═(including trivalent group of isocyanuric ring structure), trivalent group —P═, trivalent group —PO═, trivalent group —$R^1C$═, trivalent group —$R^3Si$═, tetravalent group —C≡, tetravalent group —O—C≡, tetravalent group —Si≡, or di- to octavalent siloxane residues. In formulae (1) to (3), M in Z is a linking group between L (or Rf group) and W group, and M in Z' is a group to link with Rf group via L (or Rf groups together).

Herein, $R^1$ is each independently a $C_{1-3}$ alkyl group, hydroxy group, group having repeating unit of $C_{1-3}$ oxyalkylene group which may have an intervening diorganosiloxane structure of 2 to 51 silicon atoms, or silyl ether group represented by $R^2_3SiO$—. $R^2$ is each independently hydrogen, a $C_{1-3}$ alkyl group, aryl group such as phenyl, or $C_{1-3}$ alkoxy group. $R^3$ is each independently a $C_{1-3}$ alkyl group, $C_2$ or $C_3$ alkenyl group, $C_{1-3}$ alkoxy group, or chloro. $R^4$ is a $C_{1-3}$ alkyl group or $C_{6-10}$ aryl group such as phenyl. When M is a siloxane residue, it preferably has a straight, branched or cyclic organopolysiloxane structure of 2 to 51 silicon atoms, preferably 2 to 13 silicon atoms, more preferably 2 to 11 silicon atoms, even more preferably 2 to 5 silicon atoms. The organopolysiloxane having an unsubstituted or fluorinated alkyl group of 1 to 8 carbon atoms, more preferably 1 to 4 carbon atoms such as methyl, ethyl, propyl, butyl or $C_3F_7$—$C_3H_6$—, or phenyl group is preferred. The organopolysiloxane may also contain a silalkylene structure in which two silicon atoms are linked by an alkylene group, that is, Si—$(CH_2)_n$—Si wherein n is an integer of 2 to 6, preferably an integer of 2 to 4.

The following are exemplary of M defined above.

[Chem. 38]

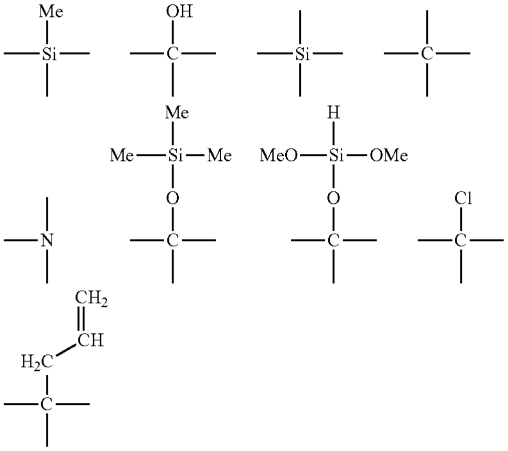

[Chem. 39]

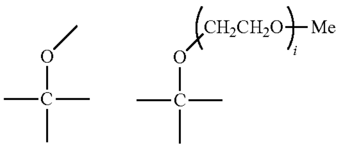

[Chem. 40]

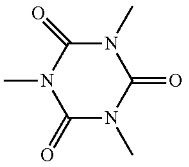

[Chem. 41]

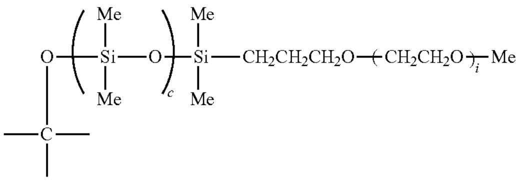

[Chem. 42]

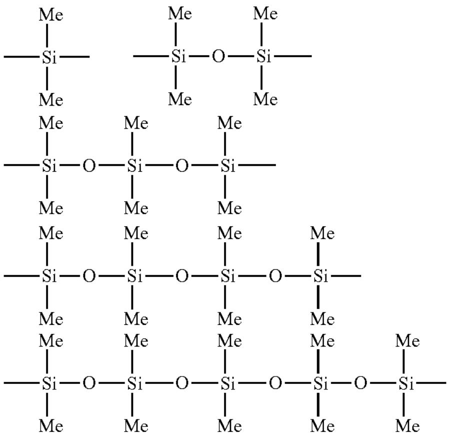

-continued

[Chem. 43]

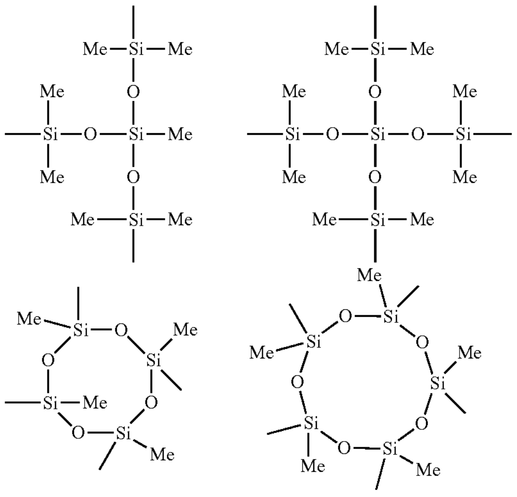

[Chem. 44]

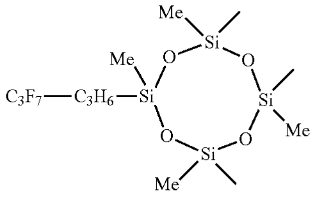

[Chem. 45]

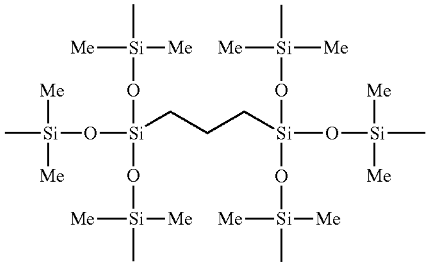

Herein i is an integer of 1 to 20, c is an integer of 1 to 50, and Me is methyl.

In formulae (1) to (3), W is a monovalent organic group terminated with a hydrolyzable group, preferably represented by the following formula.

[Chem. 46]

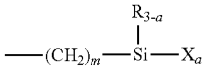

Herein R is $C_{1-4}$ alkyl or phenyl, X is a hydrolyzable group, a is 2 or 3, and m is an integer of 0 to 10.

In the above formula, examples of the hydrolyzable group X include alkoxy groups of 1 to 12 carbon atoms, especially 1 to 10 carbon atoms such as methoxy, ethoxy, propoxy and butoxy, alkoxyalkoxy groups of 2 to 12 carbon atoms, especially 2 to 10 carbon atoms such as methoxymethoxy and methoxyethoxy, acyloxy groups of 1 to 10 carbon atoms such as acetoxy, alkenyloxy groups of 2 to 10 carbon atoms such as isopropenoxy, halogen groups such as chloro, bromo and iodo, and amino groups. Inter alia, methoxy and ethoxy groups are preferred.

R is $C_{1-4}$ alkyl such as methyl or ethyl, or phenyl, with methyl being preferred.

The subscript "a" is 2 or 3. From the standpoints of reactivity and adhesion to the primer layer (second layer), "a" is preferably equal to 3. The subscript m is an integer of 0 to 10, preferably an integer of 2 to 8, more preferably 2 or 3.

In formulae (1) to (3), examples of the structure represented by $—ZW_\beta$ include the following structures.

[Chem. 47]

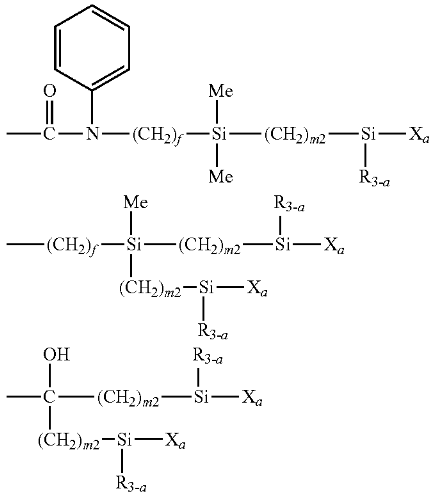

[Chem. 48]

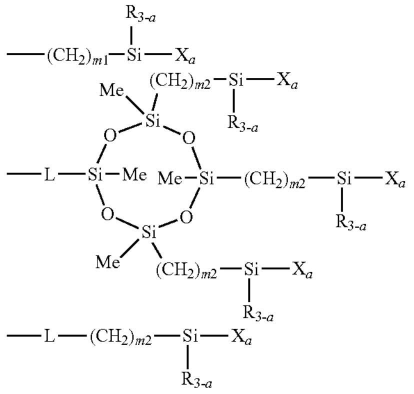

[Chem. 49]

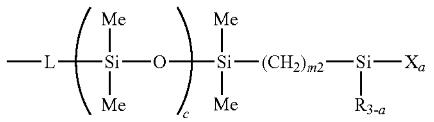

Herein, L, R, X, f, c, and a are as defined above; ml is an integer of 0 to 10, preferably an integer of 2 to 8, m2 is an integer of 1 to 10, preferably an integer of 2 to 8, and Me is methyl.

In formulae (4) and (5), Q is a single bond or divalent organic group, that is a linking group between Rf group and Y group. The divalent organic group represented by Q is preferably an unsubstituted or substituted $C_{2-12}$ divalent organic group which may contain at least one structure selected from amide bond, ether bond, ester bond, diorganosilylene groups such as dimethylsilylene, and groups represented by $—Si[OH][(CH_2)_fSi(CH_3)_3]—$ wherein f is an integer of 2 to 4, more preferably an unsubstituted or substituted $C_{2-12}$ divalent hydrocarbon group which may contain the aforementioned structure.

Examples of the unsubstituted or substituted $C_{2-12}$ divalent hydrocarbon group are as exemplified above for the unsubstituted or substituted $C_{2-12}$ divalent hydrocarbon group L.

Examples of the divalent organic group Q include groups of the following structure.

[Chem. 50]

$$-(CH_2)_u-O-(CH_2)_v-$$

[Chem. 51]

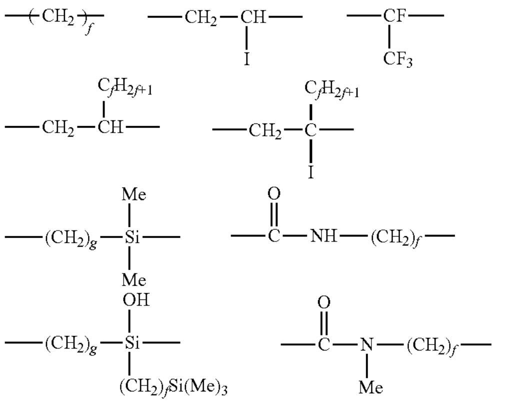

[Chem. 52]

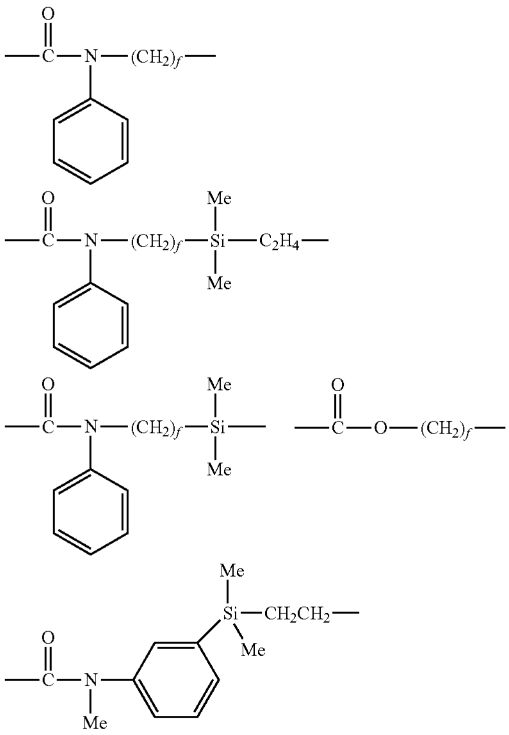

[Chem. 53]

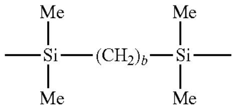

-continued

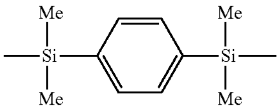

Herein f is an integer of 2 to 4, b is an integer of 2 to 6, preferably 2 to 4, u and v each are an integer of 1 to 4, g is an integer of 2 to 4, and Me is methyl.

In formulae (4) and (5), Y is each independently a divalent organic group having a hydrolyzable group, preferably a group of the following formula.

[Chem. 54]

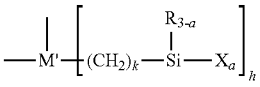

Herein R, X, and a are as defined above; k is an integer of 0 to 10, preferably an integer of 1 to 10, more preferably an integer of 2 to 8; h is an integer of 1 to 6, preferably 1 or 2. M' is an unsubstituted or substituted tri- to octavalent, preferably tri- or tetravalent hydrocarbon group, in which some or all of the carbon atoms may be replaced by silicon atoms and some or all of the carbon-bonded hydrogen atoms may be substituted by halogen atoms such as fluorine.

Preferably M' is selected from groups of the following structures.

[Chem. 55]

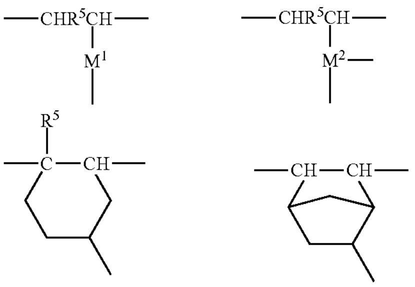

Herein $M^1$ is a single bond, unsubstituted or substituted $C_{1-6}$ divalent hydrocarbon group, or diorganosilylene group such as dimethylsilylene. $M^2$ is a trivalent group of the formula: $-R^1C\equiv$ or trivalent group of the formula: $-R^3Si\equiv$. $R^1$ and $R^3$ are as defined above. $R^5$ is hydrogen or a monovalent hydrocarbon group, typically $C_{1-6}$ alkyl group such as methyl, ethyl or propyl.

Exemplary of $M^1$ are a single bond, phenylene, dimethylsilylene and tetrafluoroethylene. The following is typical of $M^2$.

[Chem. 56]

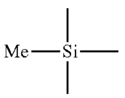

Herein Me is methyl.

For example, Y is selected from the following groups.

[Chem. 57]

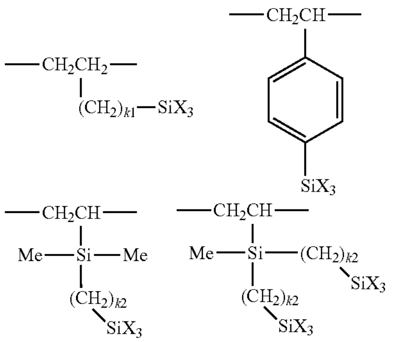

[Chem. 58]

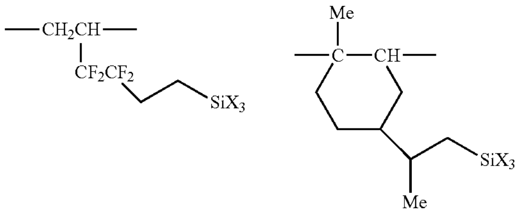

-continued

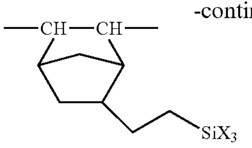

Herein X is as defined above, k1 is an integer of 0 to 10, preferably an integer of 1 to 8, k2 is an integer of 2 to 10, preferably an integer of 2 to 8, and Me is methyl.

In formulae (4) and (5), δ is an integer of 1 to 10, preferably an integer of 1 to 4.

B is each independently selected from hydrogen, $C_{1-4}$ alkyl groups such as methyl, ethyl, propyl and butyl, and halogen atoms such as fluorine, chlorine, bromine and iodine.

Examples of the hydrolyzable fluorinated organosilicon compounds (hydrolyzable fluorine-containing organosilicon compounds) having formulae (1) to (5) include the structures shown below.

[Chem. 59]

$$CF_3O{-}(CF_2CF_2O)_{q1}{-}(CF_2CF_2CF_2CF_2O)_{s1}{-}CF_2CF_2CF_2{-}C_2H_4{-}Si(OMe)_3$$

[Chem. 60]

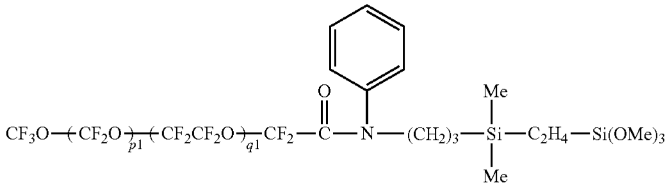

[Chem. 61]

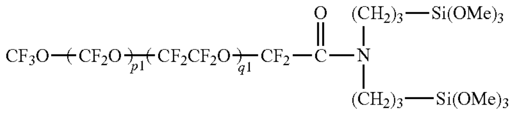

[Chem. 62]

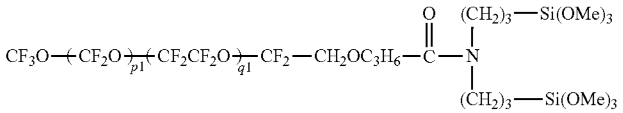

[Chem. 63]

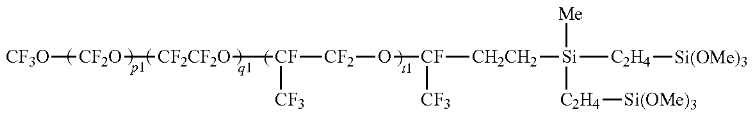

[Chem. 64]

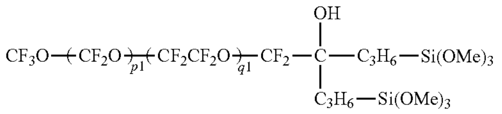

-continued
[Chem. 65]
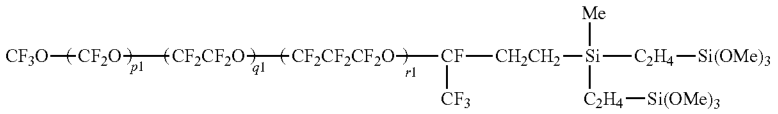
[Chem. 66]
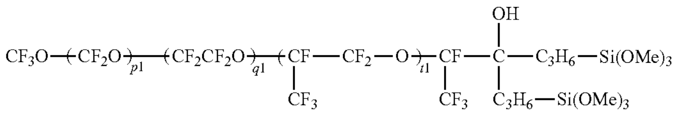
[Chem. 67]
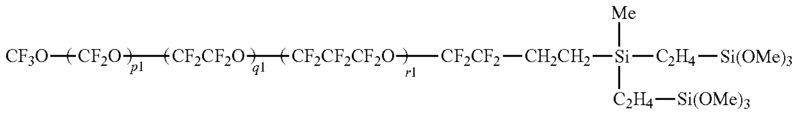
[Chem. 68]
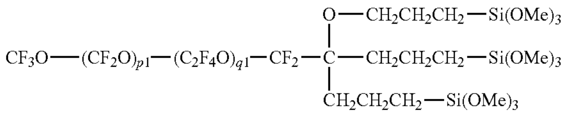
[Chem. 69]
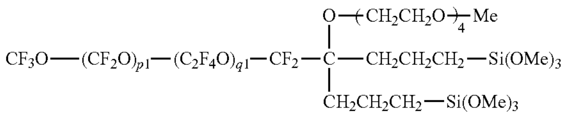
[Chem. 70]
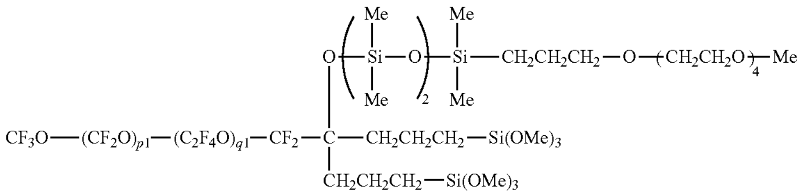
[Chem. 71]
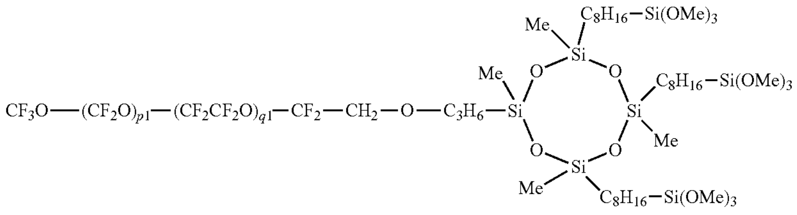
[Chem. 72]
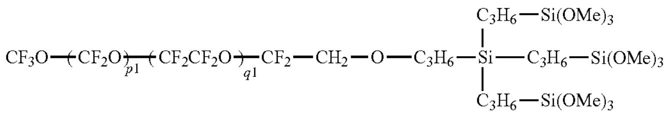
[Chem. 73]
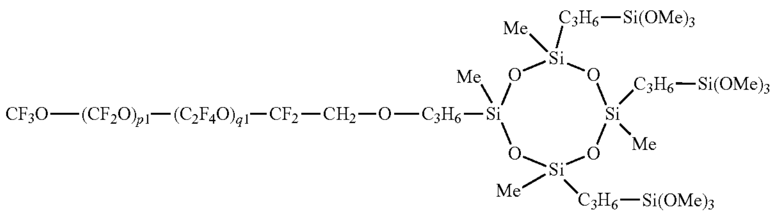

-continued
[Chem. 74]
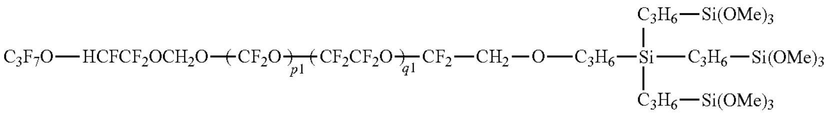
[Chem. 75]
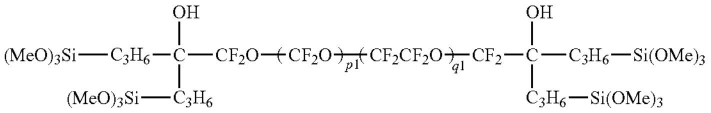
[Chem. 76]
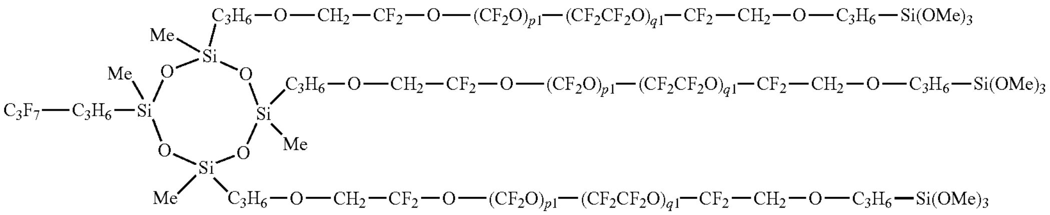
[Chem. 77]
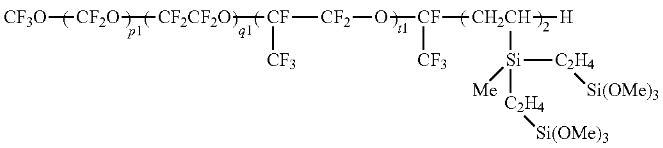
[Chem. 78]
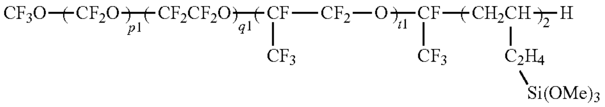
[Chem. 79]
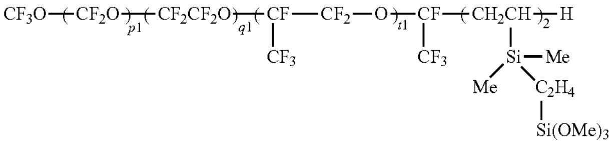
[Chem. 80]
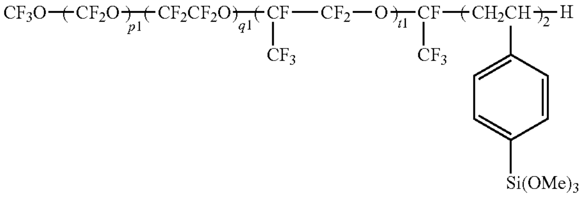
[Chem. 81]
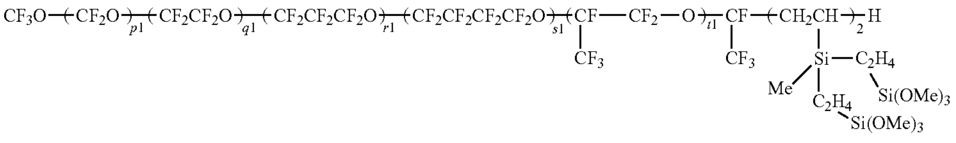
[Chem. 82]
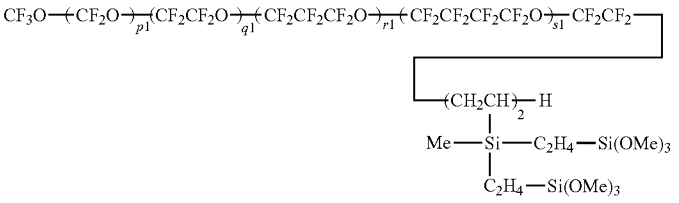

-continued

[Chem. 83]

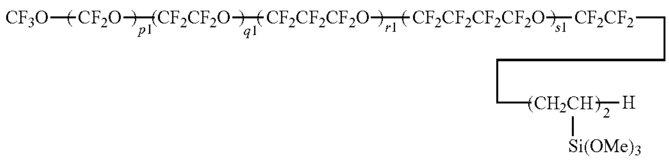

[Chem. 84]

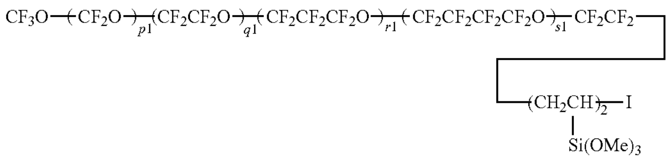

[Chem. 85]

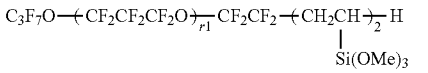

[Chem. 86]

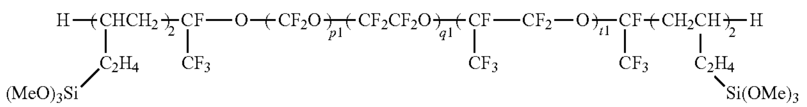

Herein Me is methyl, p1, q1, r1, s1, and t1 are each independently an integer of 1 to 200, the sum of p1, q1, r1, s1, and t1 is 3 to 500, each repeating unit in parentheses may be randomly arranged.

The hydrolyzable fluorinated organosilicon compound (hydrolyzable fluorine-containing organosilicon compound) having any of formulae (1) to (5) may contain such compounds in which some or all of the hydrolyzable groups (X) are hydrolyzed, that is, X is OH group and may further contain such compounds in which some or all of the OH groups are condensed.

Desirably the hydrolyzable fluorinated compound is previously diluted with a solvent. The solvent used herein is not particularly limited as long as the hydrolyzable fluorinated compound is uniformly dissolved. Examples include fluorine-modified aliphatic hydrocarbon solvents (e.g., perfluoroheptane and perfluorooctane), fluorine-modified aromatic hydrocarbon solvents (e.g., 1,3-trifluoromethylbenzene), fluorine-modified unsaturated hydrocarbon solvents (e.g., hexafluoroolefins and hexafluoropropene trimer), fluorine-modified ether solvents (e.g., methyl perfluorobutyl ether, ethyl perfluorobutyl ether, perfluoro(2-butyltetrahydrofuran)), fluorine-modified alkylamine solvents (e.g., perfluorotributylamine, perfluorotripentylamine), hydrocarbon solvents (e.g., petroleum benzine, toluene, xylene), and ketone solvents (e.g., acetone, methyl ethyl ketone, methyl isobutyl ketone). Of these, fluorine-modified solvents are desirable for solubility and stability, and fluorine-modified ether solvents and fluorine-modified aromatic hydrocarbon solvents are especially preferred.

The foregoing solvents may be used alone or in admixture.

The solvent is preferably used in such amounts that the concentration of the hydrolyzable fluorinated compound may fall in a range of 0.01 to 50% by weight, more preferably 0.03 to 10% by weight, even more preferably 0.05 to 1% by weight of the water/oil repellent agent (solution of the hydrolyzable fluorinated compound in the solvent).

The water/oil repellent agent containing the hydrolyzable fluorinated compound may be applied to substrates by any well-known processes such as wet coating processes (e.g., dipping, brush coating, spin coating, spraying, gravure coating, die coating, bar coating, and slit coating) and evaporation. Although coating and other conditions may accord with the prior art well-known process, it is efficient that the water/oil repellent agent containing the hydrolyzable fluorinated compound is deposited by the wet coating process because the primer layer is deposited by the wet coating process.

The hydrolyzable fluorinated compound may be cured at room temperature (25° C.) for 1 to 24 hours. Cure may be completed within a shorter time by heating at 30 to 200° C. for 1 minute to 1 hour. Cure under humid conditions (RH 50 to 90%) is preferred for accelerating hydrolysis.

It is noted that the surface of the primer layer on the substrate may be cleaned or activated by plasma treatment, UV treatment or ozone treatment before the water/oil repellent agent containing the hydrolyzable fluorinated compound is coated thereon.

The fluorinated layer (water/oil repellent layer) of the inventive water/oil repellent member has a thickness of 0.5 to 50 nm, preferably 1 to 20 nm. If the layer is too thick, the water/oil repellent layer on its outer surface may have a high surface resistivity. If the layer is too thin, surface properties and abrasion resistance may be insufficient.

The water/oil repellent layer of the inventive water/oil repellent member at its outer surface has a surface resistivity which is lower by at least 10Ω/□ than in the absence of the second layer. If the surface resistivity of the water/oil repellent layer at its outer surface is too high, the layer can cause electronic devices such as organic EL devices to malfunction and allows for deposition of dust and debris to reduce the surface visibility, detracting from optical properties and quality. Further, the surface becomes susceptible to staining As used herein, the surface resistivity is measured by a commercially available resistivity meter, for example, Hiresta-UX MCP-HT800 by Mitsubishi Chemical Analytech Co., Ltd.

The water/oil repellent layer at its outer surface has a surface resistivity of up to $1.0\times10^{11}\Omega/\square$, preferably $1.0\times10^{7}$ to $1.0\times10^{11}\Omega/\square$, more preferably $1.0\times10^{8}$ to $9.8\times10^{10}\Omega/\square$. In order that the water/oil repellent layer at its outer surface have a surface resistivity in the range, it is preferred that the primer layer (second layer) composed mainly of an organosilicon compound having a plurality of silanol groups in the molecule has a thickness of 10 to 500 nm and the water/oil repellent layer (third layer) disposed on the outer surface of the primer layer and composed mainly of a cured product of a hydrolyzable fluorinated compound has a thickness of 0.5 to 50 nm.

Examples of the inventive water/oil repellent member thus obtained include optical articles, for example, housings of car navigation systems, PC tablets, smartphones, foldable smartphones, flexible smartphones, flexible devices, digital cameras, digital video cameras, PDAs, portable audio players, car audio players, and video game consoles; optical articles such as lenses (e.g., camera lenses, surveillance cameras, vehicle mount lenses, eyeglass lenses, sunglasses, AR lenses, and VR lenses), medical instruments (e.g., gastroscopes, surgical knives, blood pressure gauges, X-ray CT, and MRI), touch panel surfaces in such displays as liquid crystal displays, organic EL displays, and flexible devices, protective films, antireflective films, IR cutoff filters, compact disks, DVDs, and Blu-ray disks; windowpanes, headlamp covers and headlamp lenses of automobiles, trains and aircraft; building members such as tiles and exterior members; kitchen building members such as system kitchen wares, bathtubs, showerheads, faucets, and cooking range hoods; bodies and mirrors of waiting rooms, art works and transportation vehicles; and covers of radars such as extremely high frequency (EHF) sensors.

EXAMPLES

Examples and Comparative Examples are shown below for further illustrating the invention although the invention is not limited thereby. Notably, Me stands for methyl.

Examples 1 to 13 and Comparative Examples 1 to 9

Test specimens of the water/oil repellent member comprising a substrate, functional film layer, primer layer and water/oil repellent layer were prepared as follows.

[Substrate]

Clear hard coat-treated PET film (specimen substrate of hard coat film FHC-53EEM2 by Higashiyama Film Co., Ltd., thickness 188 μm, width 50 mm, length 100 mm, pencil hardness: H according to JIS K5400 @500 g).

[Formation of Functional Film Layer (First Layer)]

A functional film layer was formed on the substrate by the following method.

[Formation of Functional Film Layer 1]

Functional film layer 1 of 100 nm thick was formed on the outer surface of the substrate by sputtering of silicon dioxide.

[Formation of Functional Film Layer 2]

Functional film layer 2 of 96 nm thick was formed on the outer surface of the substrate by dip coating the substrate with a treating liquid of perhydropolysilazane diluted with dibutyl ether in a concentration of 2.0 wt % as solids and curing at 80° C./80% RH for 24 hours. The dip coating included dipping the substrate in the treating liquid for 30 seconds and pulling up at 150 mm/min. The raw material of Functional film layer 2 or perhydropolysilazane reacts with airborne moisture (water) in the course of curing to form a silicon dioxide ($SiO_2$) layer via dehydrogenation while releasing ammonia.

[Formation of Functional Film Layer 3]

Functional film layer 3 of 10 nm thick was formed on the outer surface of the substrate by sputtering of silicon dioxide.

[Formation of Functional Film Layer 4]

Functional film layer 4 was formed as the outermost layer of an antireflective layer on the surface of the substrate by sputtering of silicon dioxide. The antireflective layer had a multilayer structure including $Nb_2O_5$ (12 nm), $SiO_2$ (34 nm), $Nb_2O_5$ (116 nm), and $SiO_2$ (76 nm) stacked from the substrate side.

[Formation of Primer Layer (Second Layer)]

A primer layer was formed on the substrate or functional film layer by the following method.

[Formation of Primer Layer 1]

Primer layer 1 of 10 nm thick was formed on the outer surface of the substrate by dip coating the substrate with a treating liquid of the hydrolytic partial condensate of tetraethoxysilane (Mw 25,000, silanol content 0.015 mol/g) diluted with butanol in a concentration of 0.2 wt % as solids by means of a bar coater (Bar Coater No. 02 by Daiichi Rika Co., Ltd.) and drying the coating at 80° C. for 1 minute to evaporate off the butanol.

[Formation of Primer layer 2]

Primer layer 2 of 30 nm thick was formed on the outer surface of the substrate by dip coating the substrate with a treating liquid of the hydrolytic partial condensate of tetraethoxysilane (Mw 25,000, silanol content 0.015 mol/g) diluted with butanol in a concentration of 0.78 wt % as solids and drying the coating at room temperature (25° C.) for 60 minutes to evaporate off the butanol. The dip coating step included dipping the substrate in the treating liquid for 60 seconds and pulling up at 150 mm/min.

[Formation of Primer Layer 3]

Primer layer 3 of 91 nm thick was formed on the outer surface of the substrate by dip coating the substrate with a treating liquid of the hydrolytic partial condensate of tetraethoxysilane (Mw 25,000, silanol content 0.015 mol/g) diluted with butanol in a concentration of 2.0 wt % as solids and drying the coating at room temperature (25° C.) for 60 minutes to evaporate off the butanol. The dip coating step included dipping the substrate in the treating liquid for 60 seconds and pulling up at 150 mm/min.

[Formation of Primer Layer 4]

Primer layer 4 of 210 nm thick was formed on the outer surface of the substrate by dip coating the substrate with a treating liquid of the hydrolytic partial condensate of tetraethoxysilane (Mw 25,000, silanol content 0.015 mol/g) diluted with butanol in a concentration of 4.0 wt % as solids and drying the coating at room temperature (25° C.) for 60 minutes to evaporate off the butanol. The dip coating step included dipping the substrate in the treating liquid for 60 seconds and pulling up at 150 mm/min.

[Formation of Primer Layer 5]

Primer layer 5 of 5 nm thick was formed on the outer surface of the substrate by coating the substrate with a treating liquid of the hydrolytic partial condensate of tetraethoxysilane (Mw 25,000, silanol content 0.015 mol/g) diluted with butanol in a concentration of 0.1 wt % as solids by means of a bar coater (Bar Coater No. 02 by Daiichi Rika Co., Ltd.) and drying the coating at 80° C. for 1 minute to evaporate off the butanol.

[Formation of Water/Oil Repellent Layer (Third Layer)]

Further, a water/oil repellent layer was formed and laid on the outer surface of the substrate or each of the substrates having functional film layers 1 to 4 (shown in Table 1) or Primer layers 1 to 5 (shown in Table 1) formed thereon, by the following method.

[Formation of Water/Oil Repellent Layer 1]

Compound 1 shown below was diluted with a fluorine-modified ether solvent (Novec 7200 by 3M, ethyl perfluorobutyl ether) in a concentration of 0.1 wt % as solids to form a treating liquid. Using a spray coater (NST-51 by T&K Co., Ltd.), the treating liquid was sprayed onto the primer layer on the substrate. The coating was heated at 80° C. for 30 minutes to evaporate off the fluorine-modified ether solvent and at the same time, cure the solids in the treating liquid to form a cured film (or water/oil repellent layer), yielding a specimen. The water/oil repellent layer 1 had an average thickness of ~10 nm as computed from the F content detected by an X-ray fluorescence analyzer (ZSXmini2 by Rigaku Corp.).

[Chem. 87]

[Compound 1]

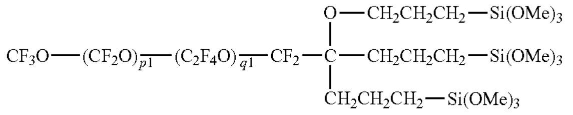

(p1 + q1 = 48, p1:q1 = 24:24)

[Formation of Water/Oil Repellent Layer 2]

Compound 2 shown below was diluted with a fluorine-modified ether solvent (Novec 7200 by 3M) in a concentration of 20 wt % as solids to form a treating liquid. Using a vacuum evaporation system (VTR-250 by Ulvac Inc.), the treating liquid was evaporated and deposited onto the primer layer on the substrate. It was allowed to stand at 25° C. for 60 minutes to cure the solids as vacuum evaporated to form a cured film (water/oil repellent layer), yielding a specimen. The water/oil repellent layer 2 had an average thickness of ~11 nm as computed from the F content detected by an X-ray fluorescence analyzer (ZSXmini2 by Rigaku Corp.).

[Chem. 88]

[Compound 2]

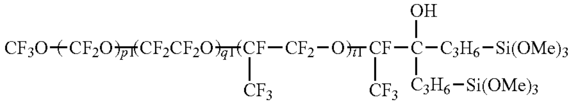

-continued (p1 + q1 + t1 = 35, p1:q1:t1 = 17:16:2)

[Formation of Water/Oil Repellent Layer 3]

Compound 3 shown below was diluted with a fluorine-modified ether solvent (Novec 7200 by 3M) in a concentration of 0.2 wt % as solids to form a treating liquid. Using a bar coater (Bar Coater No. 02 by Daiichi Rika Co., Ltd.), the treating liquid was coated onto the primer layer on the substrate. It was allowed to stand at 25° C. for 60 minutes for allowing the fluorine-modified ether solvent to evaporate off and at the same time, curing the solids in the treating liquid to form a cured film (water/oil repellent layer), yielding a specimen. The water/oil repellent layer 3 had an average thickness of ~15 nm as computed from the F content detected by an X-ray fluorescence analyzer (ZSXmini2 by Rigaku Corp.).

[Chem. 89]

[Compoumnd 3]

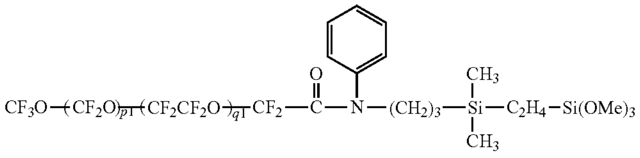

(p1 + q1 = 60, p1:q1 = 29:31)

[Formation of Water/Oil Repellent Layer 4]

Compound 4 shown below was diluted with a fluorine-modified ether solvent (Novec 7200 by 3M) in a concentration of 0.1 wt % as solids to form a treating liquid. Using a spray coater (NST-51 by T&K Co., Ltd.), the treating liquid was sprayed onto the primer layer on the substrate. The coating was heated at 80° C. for 30 minutes to evaporate off the fluorine-modified ether solvent and at the same time, cure the solids in the treating liquid to form a cured film (or water/oil repellent layer), yielding a specimen. The water/oil repellent layer 4 had an average thickness of ~13 nm as computed from the F content detected by an X-ray fluorescence analyzer (ZSXmini2 by Rigaku Corp.).

[Chem. 90]

[Compound 4]

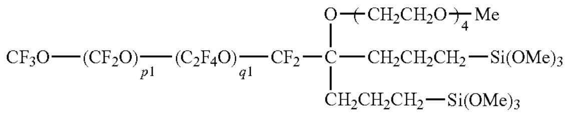

(p1 + q1 = 42, p1:q1 = 20:22)

[Formation of Water/Oil Repellent Layer 5]

Compound 5 shown below was diluted with a fluorine-modified ether solvent (Novec 7200 by 3M) in a concentration of 0.1 wt % as solids to form a treating liquid. Using a spray coater (NST-51 by T&K Co., Ltd.), the treating liquid was sprayed onto the primer layer on the substrate. The coating was heated at 80° C. for 30 minutes to evaporate off the fluorine-modified ether solvent and at the same time, cure the solids in the treating liquid to form a cured film (or water/oil repellent layer), yielding a specimen. The water/oil repellent layer 5 had an average thickness of ~13 nm as computed from the F content detected by an X-ray fluorescence analyzer (ZSXmini2 by Rigaku Corp.).

[Chem. 91]

[Compound 5]

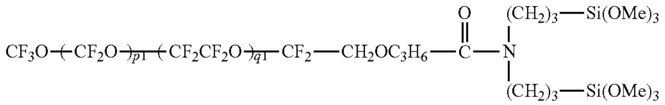

(p1 + q1 = 50, p1:q1 = 26:24)

[Formation of Water/Oil Repellent Layer 6]

Compound 6 shown below was diluted with a fluorine-modified ether solvent (Novec 7200 by 3M) in a concentration of 0.1 wt % as solids to form a treating liquid. Using a spray coater (NST-51 by T&K Co., Ltd.), the treating liquid was sprayed onto the primer layer on the substrate. The coating was heated at 80° C. for 30 minutes to evaporate off the fluorine-modified ether solvent and at the same time, cure the solids in the treating liquid to form a cured film (or water/oil repellent layer), yielding a specimen. The water/oil repellent layer 6 had an average thickness of ~12 nm as computed from the F content detected by an X-ray fluorescence analyzer (ZSXmini2 by Rigaku Corp.).

[Chem. 92]

[Compound 6]

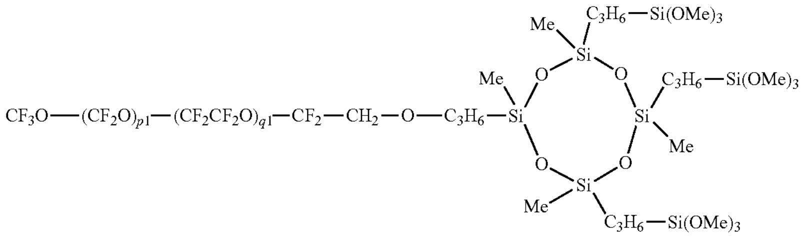

(p1 + q1 = 38, p1:q1 = 19:19)

On the specimens of water/oil repellent member having a functional film layer, a primer layer, and/or a water/oil repellent layer, the following measurements were carried out. The results are also shown in Table 1.

[Antistatic Property]

Using a resistivity meter Hiresta-UX MCP-HT800 (Mitsubishi Chemical Analytech Co., Ltd.), the surface resistivity was measured under the following conditions and reported as an index of antistatic property.

Applied voltage: 1,000 V

[Water and Oil Repellency]

Using a contact angle meter (DropMaster by Kyowa Interface Science Co., Ltd.), the contact angles of the cured film (water/oil repellent layer) of the specimen with water and oleic acid were measured.

[Eraser Abrasion Resistance]

Using a rubbing tester (Shinto Scientific Co., Ltd.), an abrasion resistance test was carried out on the cured film (water/oil repellent layer) of the specimen under the following conditions. The cured film (or water/oil repellent layer) after 100 back-and-forth rubbing cycles was measured for a contact angle with water (or water repellency) as above. The number of rubbing cycles within which the contact angle with water was kept above 100° was reported as an index of eraser abrasion resistance. The test environmental conditions included 25° C. and humidity 50%.

Eraser: by Minoan Co., Ltd.

Contact area: diameter 6 mm

Moving distance (one way): 30 mm

Moving speed: 3,600 mm/min

Load: 500 g/diameter 6 mm

TABLE 1

| | | Functional film layer No. [first layer] | Primer layer No. [second layer] | Primer layer Thickness (nm) | Watcr/oil repellent layer No. [third layer] | Water/oil repellent layer Thickness (nm) | Water/oil repellency (°) Water contact angle | Water/oil repellency (°) Oleic acid contact angle | Antistatic property (Ω/□) | Eraser abrasion resistance (cycles) |
|---|---|---|---|---|---|---|---|---|---|---|
| Example | 1 | 1 | 1 | 10 | 1 | 10 | 113 | 73 | $1.0 \times 10^{11}$ | 500 |
| | 2 | 1 | 2 | 30 | 1 | 10 | 114 | 74 | $3.8 \times 10^{10}$ | 11,000 |
| | 3 | 1 | 3 | 91 | 1 | 10 | 113 | 72 | $2.5 \times 10^{8}$ | >20,000 |
| | 4 | 1 | 4 | 210 | 1 | 10 | 114 | 75 | $2.1 \times 10^{8}$ | >20,000 |
| | 5 | 1 | 2 | 30 | 2 | 11 | 112 | 73 | $4.5 \times 10^{10}$ | 800 |
| | 6 | 2 | 2 | 30 | 1 | 10 | 113 | 73 | $7.7 \times 10^{9}$ | 700 |
| | 7 | 1 | 3 | 91 | 3 | 15 | 114 | 74 | $2.9 \times 10^{8}$ | 1,800 |
| | 8 | 1 | 2 | 30 | 4 | 13 | 115 | 75 | $8.5 \times 10^{9}$ | 3,000 |
| | 9 | 1 | 2 | 30 | 5 | 13 | 117 | 76 | $3.1 \times 10^{10}$ | 2,500 |
| | 10 | 1 | 2 | 30 | 6 | 12 | 115 | 75 | $3.2 \times 10^{10}$ | 1,000 |

TABLE 1-continued

| | | Functional film layer No. [first layer] | Primer layer No. [second layer] | Primer layer Thickness (nm) | Water/oil repellent layer No. [third layer] | Water/oil repellent layer Thickness (nm) | Water/oil repellency (°) Water contact angle | Oleic acid contact angle | Antistatic property (Ω/□) | Eraser abrasion resistance (cycles) |
|---|---|---|---|---|---|---|---|---|---|---|
| | 11 | 1 | 3 | 91 | 6 | 12 | 114 | 73 | $4.5 \times 10^{8}$ | 1,500 |
| | 12 | 3 | 2 | 30 | 1 | 10 | 115 | 74 | $7.8 \times 10^{10}$ | 1,000 |
| | 13 | 4 | 2 | 10 | 1 | 12 | 115 | 73 | $1.0 \times 10^{11}$ | 5,000 |
| Comparative Example | 1 | nil | nil | — | 1 | 10 | 98 | 62 | *1) | 0 |
| | 2 | 1 | nil | — | 1 | 10 | 115 | 75 | $3.8 \times 10^{13}$ | 200 |
| | 3 | 2 | nil | — | 1 | 10 | 114 | 72 | $1.5 \times 10^{13}$ | 100 |
| | 4 | 1 | nil | — | 2 | 11 | 115 | 74 | $5.5 \times 10^{13}$ | 200 |
| | 5 | 1 | nil | — | 3 | 15 | 113 | 74 | $6.2 \times 10^{13}$ | 100 |
| | 6 | 1 | nil | — | 4 | 13 | 114 | 75 | $4.3 \times 10^{13}$ | 100 |
| | 7 | 1 | nil | — | 5 | 13 | 113 | 73 | $8.8 \times 10^{13}$ | 100 |
| | 8 | 1 | nil | — | 6 | 12 | 114 | 74 | $7.2 \times 10^{13}$ | 300 |
| | 9 | 1 | 5 | 5 | 1 | 10 | 114 | 74 | *1) | 200 |

*1) surface resistivity was too high to measure

As is evident from the results in Table 1, Examples 1 to 13 exhibited excellent water/oil repellency and eraser abrasion resistance. By contrast, Comparative Examples 1 to 9 exhibited unsatisfactory abrasion resistance as demonstrated by the count of eraser abrasion resistance being less than 500 cycles. Comparative Example 1 exhibited inferior initial water/oil repellency because the water/oil repellent agent was coated directly on the hard coat layer. Comparative Example 2 exhibited insufficient abrasion resistance because the primer layer was omitted. Comparative Example 3 wherein a polysilazane layer was formed as the functional film layer exhibited insufficient abrasion resistance because the primer layer was omitted. Comparative Examples 4 to 8 wherein the water/oil repellent agent was changed exhibited insufficient abrasion resistance because the primer layer was omitted. Comparative Example 9 exhibited insufficient abrasion resistance because the primer layer was too thin.

In Examples 1 to 13, the water/oil repellent layer on its outer surface had a surface resistivity of up to $1.0\times10^{11}$ Ω/□ because the primer layer of at least 10 nm thick was formed.

The invention claimed is:

1. A water/oil repellent member comprising a substrate, a functional film layer disposed on at least one surface of the substrate as a first layer, a primer layer disposed on the outer surface of the functional film layer as a second layer, and a water/oil repellent layer disposed on the outer surface of the primer layer as a third layer, wherein the primer layer is a layer composed mainly of an organosilicon compound having a plurality of silanol groups in the molecule which has a silanol content of 0.002 to 0.042 mol/g and having a thickness of 10 to 500 nm, and the water/oil repellent layer is a layer composed mainly of a cured product of a hydrolyzable fluorinated compound and having a thickness of 0.5 to 50 nm, and the water/oil repellent member has a surface resistivity of up to $1.0\times10^{11}$ Ω/□ at an outer surface of the water/oil repellent layer.

2. The water/oil repellent member of claim 1 wherein the functional film layer is, in its entirety, composed mainly of silicon dioxide or includes at least an outermost layer composed of silicon dioxide.

3. The water/oil repellent member of claim 1 wherein the organosilicon compound having a plurality of silanol groups in the molecule is a hydrolytic partial condensate of a tetraalkoxysilane.

4. The water/oil repellent member of claim 1 wherein the hydrolyzable fluorinated compound has at least one hydrolyzable silyl group at one or more ends of the molecular chain, the hydrolyzable silyl group being selected from among $C_{1-12}$ alkoxy groups, $C_{2-12}$ alkoxyalkoxy groups, $C_{1-10}$ acyloxy groups, $C_{2-10}$ alkenyloxy groups, halogen or amino-containing silyl groups, and silazane groups.

5. The water/oil repellent member of claim 1 wherein the hydrolyzable fluorinated compound is a fluorooxyalkylene group-containing organosilicon compound having, in its molecule, a divalent linear perfluorooxyalkylene polymer residue of the formula: $-(CF_2)_d-O-(CF_2O)_p(CF_2CF_2O)_q(CF_2CF_2CF_2O)_r(CF_2CF_2CF_2CF_2O)_s(CF(CF_3)CF_2O)_t-(CF_2)_d-$ wherein p, q, r, s, and t are each independently an integer of 0 to 200, p+q+r+s+t is 3 to 500, each repeat unit in parentheses may be randomly arranged, d is independently an integer of 0 to 8, the unit with d may be linear or branched, and having at least one hydrolyzable silyl group at one or more ends of the molecular chain.

6. The water/oil repellent member of claim 1 wherein the hydrolyzable fluorinated compound is at least one compound selected from hydrolyzable fluorinated organosilicon compounds having the general formulae (1) to (5):

$$(A\text{-}Rf)_{\alpha}-ZW_{\beta} \qquad (1)$$

$$Rf-(ZW_{\beta})_2 \qquad (2)$$

$$Z'-(Rf-ZW_{\beta})_{\gamma} \qquad (3)$$

wherein Rf is a divalent linear perfluorooxyalkylene polymer residue of the formula: $-(CF_2)_d-O-(CF_2O)_p(CF_2CF_2O)_q(CF_2CF_2CF_2O)_r(CF_2CF_2CF_2CF_2O)_s(CF(CF_3)CF_2O)_t-(CF_2)_d-$, p, q, r, s, and t are each independently an integer of 0 to 200, p+q+r+s+t is 3 to 500, each repeat unit in parentheses may be randomly arranged, d is independently an integer of 0 to 8, the unit with d may be linear or branched, A is fluorine, hydrogen or a monovalent fluorinated group terminated with $-CF_3$, $-CF_2H$ or $-CH_2F$ group, Z and Z' are each independently a single bond, or a di- to octavalent organic group which may contain nitrogen, oxygen, silicon, phosphorus or sulfur and which may be fluorinated, W is a monovalent organic group terminated with a hydrolyzable group, α and β are each independently an integer of 1 to 7, α+β is 2 to 8, and γ is an integer of 2 to 8, $$A\text{-}Rf\text{-}Q\text{-}(Y)_{\delta}-B \qquad (4)$$

$$Rf\text{-}(Q\text{-}(Y)_{\delta}-B)_2 \qquad (5)$$

wherein Rf and A are as defined above, Q is a single bond or divalent organic group, δ is each independently an integer of 1 to 10, Y is a divalent organic group having a hydrolyzable group, and B is hydrogen, $C_{1-4}$ alkyl or halogen.

7. The water/oil repellent member of claim 6 wherein the hydrolyzable fluorinated organosilicon compound is selected from the following:

[Chem. 1]

$CF_3O-(CF_2CF_2O)_{q1}-(CF_2CF_2CF_2CF_2O)_{s1}-CF_2CF_2CF_2-C_2H_4-Si(OMe)_3$

[Chem. 2]

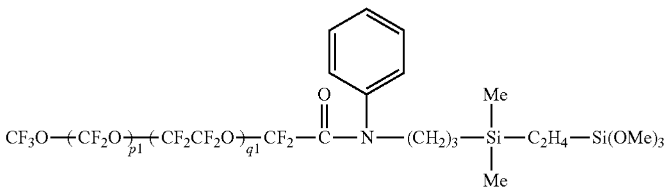

[Chem. 3]

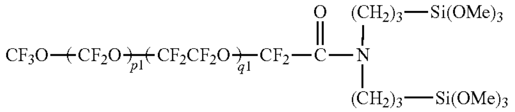

[Chem. 4]

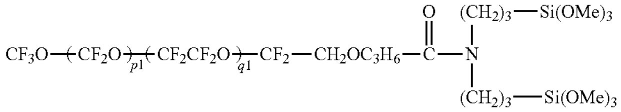

[Chem. 5]

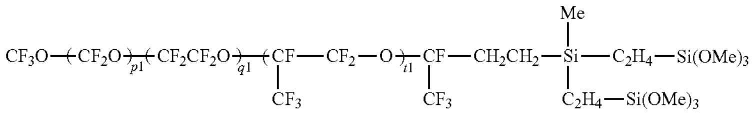

[Chem. 6]

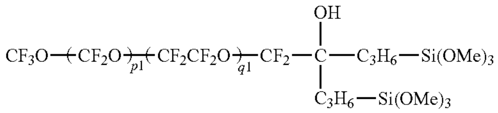

[Chem. 7]

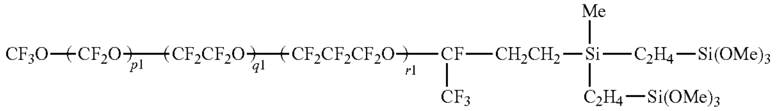

[Chem. 8]

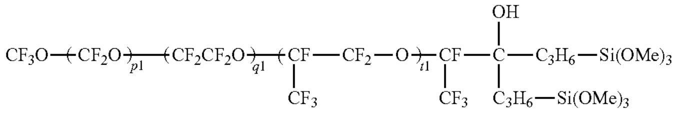

[Chem. 9]

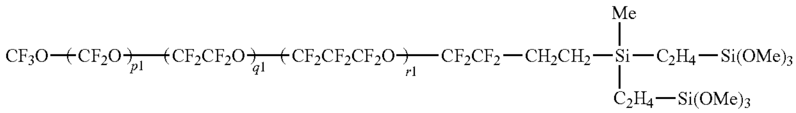

[Chem. 10]

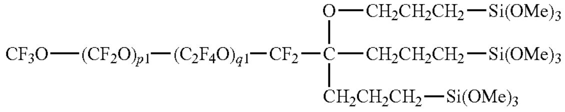

-continued
[Chem. 11]
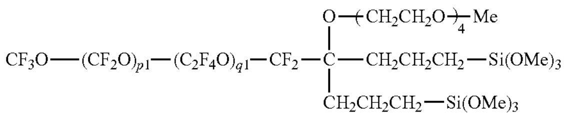
[Chem. 12]
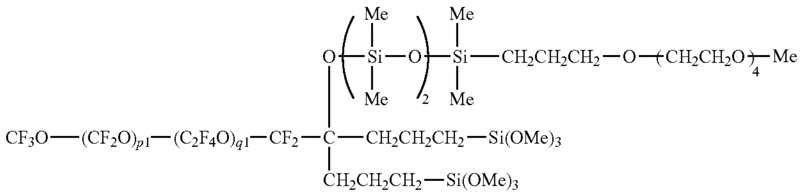
[Chem. 13]
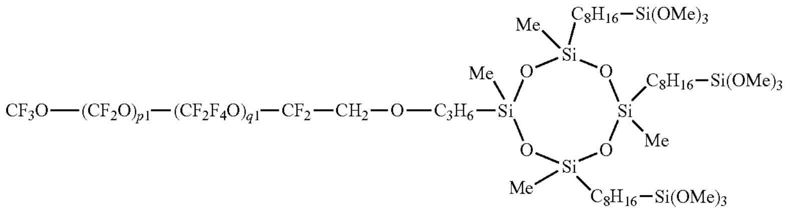
[Chem. 14]
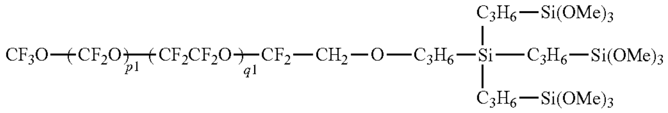
[Chem. 15]
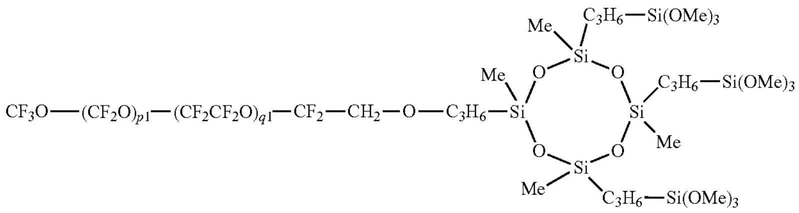
[Chem. 16]
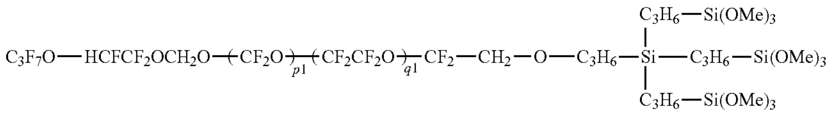
[Chem. 17]
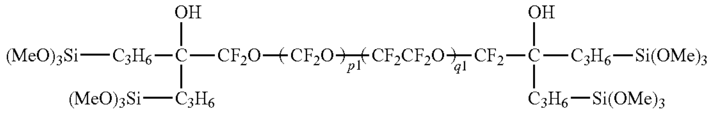
[Chem. 18]
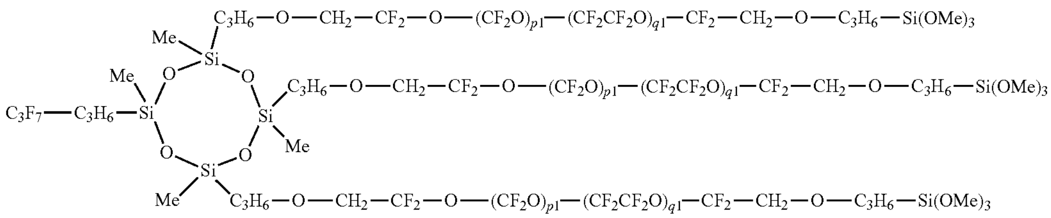

-continued
[Chem. 19]
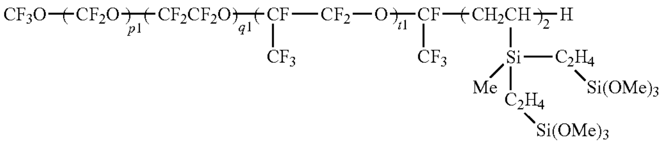
[Chem. 20]
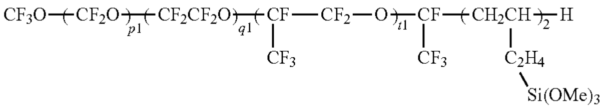
[Chem. 21]
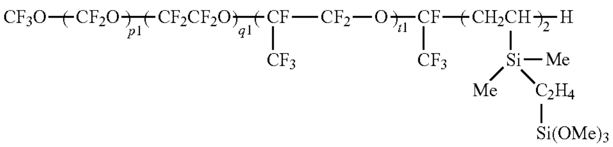
[Chem. 22]
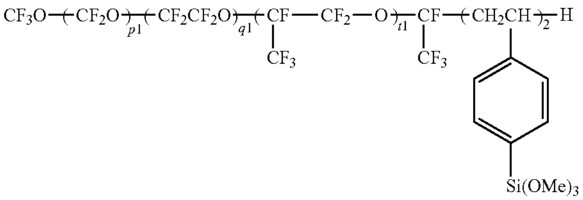
[Chem. 23]
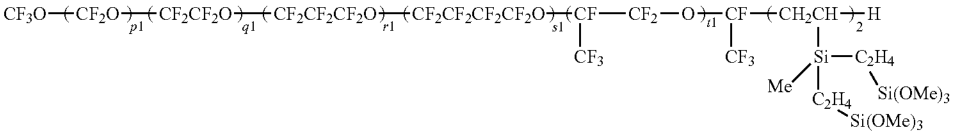
[Chem. 24]
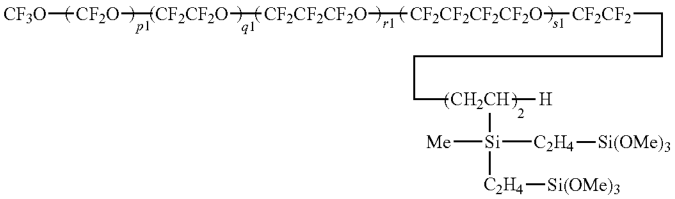
[Chem. 25]
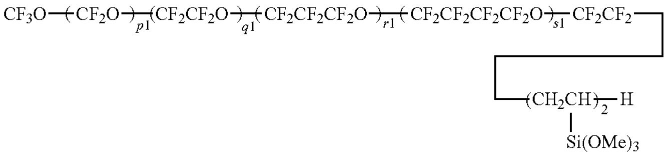
[Chem. 26]
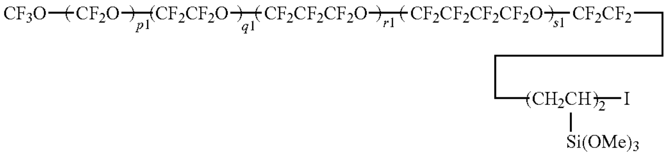
[Chem. 27]
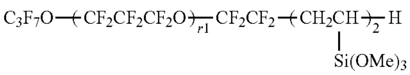

-continued

[Chem. 28]

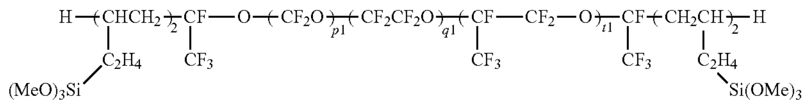

wherein Me is methyl, p1, q1, r1, s1, and t1 are each independently an integer of 1 to 200, the sum of p1, q1, r1, s1, and t1 is 3 to 500, each repeat unit in parentheses may be randomly arranged.

8. The water/oil repellent member of claim 1 wherein the substrate is of a resin, ceramic, metal, quartz, glass, sapphire, or diamond.

9. A method for preparing the water/oil repellent member of claim 1, the method comprising the steps of:

forming a functional film layer on at least one surface of a substrate, the functional film layer being composed mainly of silicon dioxide or including at least an outermost layer of silicon dioxide, wet coating a solution of an organosilicon compound having a plurality of silanol groups in the molecule in a solvent onto the outer surface of the functional film layer, and then evaporating the solvent to form and lay a primer layer on at least one surface of the substrate, wet coating a solution of a hydrolyzable fluorinated compound in a solvent onto the outer surface of the primer layer and then evaporating the solvent, or evaporating off the solvent from the solution and dry coating the hydrolyzable fluorinated compound onto the outer surface of the primer layer, and curing the hydrolyzable fluorinated compound to form and lay a water/oil repellent layer on the outer surface of the primer layer.

10. The water/oil repellent member of claim 1 wherein the functional film layer has a thickness of 10 to 150 nm.

11. The water/oil repellent member of claim 1 wherein the functional film layer is a silicon dioxide layer having a thickness of 10 to 500 nm or has a multilayer structure including at least an outermost layer composed of silicon dioxide and having a thickness of 10 to 500 nm.

12. The water/oil repellent member of claim 1 wherein the primer layer has a thickness of 10 to 210 nm, and/or the water/oil repellent layer has a thickness of 10 to 15 nm.

13. The water/oil repellent member of claim 1 wherein the organosilicon compound having the plurality of silanol groups in the molecule has a weight average molecular weight of 300 to 100,000.

14. The water/oil repellent member of claim 1 wherein the functional film layer is any one of a hard coat layer composed of a silicon dioxide layer, a hard coat layer of two, three or multilayer structure including a hard coat layer and a silicon dioxide layer formed thereon, an antireflective layer of two, three or multilayer structure having an outermost layer of silicon dioxide formed on the substrate, and an IR cutoff filter layer of two, three or multilayer structure having an outermost layer of silicon dioxide formed on the substrate.

15. The water/oil repellent member of claim 1 wherein the substrate is of a resin, ceramic, metal, quartz, sapphire, or diamond.

* * * * *